US 9,537,114 B2

(12) United States Patent
Sakaguchi

(10) Patent No.: US 9,537,114 B2
(45) Date of Patent: Jan. 3, 2017

(54) ORGANIC EL LIGHT EMITTING DEVICE, MANUFACTURING METHOD THEREFOR, AND ORGANIC EL ILLUMINATION DEVICE

(71) Applicant: Yoshikazu Sakaguchi, Tokyo (JP)

(72) Inventor: Yoshikazu Sakaguchi, Tokyo (JP)

(73) Assignee: NEC LIGHTING, LTD., Tokyo (JP)

( * ) Notice: Subject to any disclaimer, the term of this patent is extended or adjusted under 35 U.S.C. 154(b) by 0 days.

(21) Appl. No.: 14/991,372

(22) Filed: Jan. 8, 2016

(65) Prior Publication Data

US 2016/0126508 A1     May 5, 2016

Related U.S. Application Data

(60) Continuation of application No. 14/595,414, filed on Jan. 13, 2015, now Pat. No. 9,269,928, which is a (Continued)

(30) Foreign Application Priority Data

Mar. 29, 2011     (JP) ................................. 2011-073273

(51) Int. Cl.
*H01L 51/52*     (2006.01)
*H01L 51/56*     (2006.01)

(52) U.S. Cl.
CPC ....... *H01L 51/5203* (2013.01); *H01L 51/5212* (2013.01); *H01L 51/5237* (2013.01);
(Continued)

(58) Field of Classification Search
CPC ............ H01L 51/5203; H01L 51/5212; H01L 51/5237; H01L 51/5253; H01L 51/56
See application file for complete search history.

(56) References Cited

U.S. PATENT DOCUMENTS 6,350,996 B1     2/2002     Kawai et al.
6,833,668 B1    12/2004    Yamada et al.
(Continued)

FOREIGN PATENT DOCUMENTS

EP     1763096 A2     3/2007
EP     2249412 A1    11/2010
(Continued)

OTHER PUBLICATIONS

Communication dated Sep. 22, 2014, from the European Patent Office in European Application No. 12764952.3.
(Continued)

*Primary Examiner* — Allan R Wilson
(74) *Attorney, Agent, or Firm* — Sughrue Mion, PLLC

(57) ABSTRACT

An organic EL light emitting device includes a transparent substrate, a transparent electrode film formed on the substrate, a positive electrode contact portion in contact with a part of the transparent electrode film and electrically connected therewith, an insulating layer formed on the transparent electrode film such that the an insulating layer covers a portion excluding a light emitting part, an organic light emitting layer formed on the transparent electrode film and on the insulating layer, a negative electrode film formed on the organic light emitting layer, a negative electrode contact portion in contact with at least a part of the negative electrode film and electrically connected therewith, and a protective layer for separating and electrically insulating the positive electrode contact portion and the transparent electrode film from the negative electrode contact portion.

12 Claims, 11 Drawing Sheets

Related U.S. Application Data division of application No. 14/008,461, filed as application No. PCT/JP2012/058490 on Mar. 29, 2012, now Pat. No. 8,963,144.

(52) U.S. Cl.
CPC .......... *H01L 51/5253* (2013.01); *H01L 51/56* (2013.01); *H01L 2251/5361* (2013.01); *H01L 2251/5392* (2013.01)

(56) References Cited

U.S. PATENT DOCUMENTS

| | | | |
|---|---|---|---|
| 7,368,659 B2* | 5/2008 | Heller | H01L 51/0021 |
| | | | 136/263 |
| 8,344,360 B2 | 1/2013 | Auch et al. | |
| 8,395,319 B2 | 3/2013 | Tchakarov et al. | |
| 8,558,455 B2 | 10/2013 | Kang et al. | |
| 2002/0125817 A1 | 9/2002 | Yamazaki et al. | |
| 2002/0153523 A1 | 10/2002 | Bernius et al. | |
| 2005/0116629 A1* | 6/2005 | Takamura | H01L 51/5212 |
| | | | 313/506 |
| 2006/0125387 A1* | 6/2006 | Adachi | H01L 51/5088 |
| | | | 313/506 |
| 2006/0278945 A1 | 12/2006 | Sakurai | |
| 2007/0120108 A1 | 5/2007 | Asabe | |
| 2009/0015151 A1 | 1/2009 | Ishihara et al. | |
| 2009/0153043 A1 | 6/2009 | Uchida et al. | |
| 2009/0302760 A1 | 12/2009 | Tchakarov et al. | |
| 2010/0176385 A1* | 7/2010 | Lifka | H01L 51/441 |
| | | | 257/40 |
| 2010/0320484 A1 | 12/2010 | Hirakata et al. | |
| 2011/0025197 A1 | 2/2011 | Kawamura et al. | |
| 2011/0031500 A1* | 2/2011 | Suh | H01L 27/3279 |
| | | | 257/59 |
| 2012/0007134 A1 | 1/2012 | Miyai et al. | |
| 2012/0286298 A1* | 11/2012 | Pang | H01L 51/5203 |
| | | | 257/88 |
| 2012/0292656 A1* | 11/2012 | Yim | H01L 51/5212 |
| | | | 257/99 |
| 2015/0011030 A1 | 1/2015 | Choi et al. | |

FOREIGN PATENT DOCUMENTS

| | | |
|---|---|---|
| EP | 2403317 A1 | 1/2012 |
| JP | 2001-244069 A | 9/2001 |
| JP | 2004-296297 A | 10/2004 |
| JP | 2009-140817 A | 6/2009 |
| JP | 2009-259413 A | 11/2009 |
| JP | 2010-198980 A | 9/2010 |
| JP | 2010-533355 A | 10/2010 |
| WO | 2008/062645 A1 | 5/2008 |
| WO | 2009/125696 A1 | 10/2009 |

OTHER PUBLICATIONS

International Search Report for PCT/JP2012/058490, filed Jul. 3, 2012.

Communication dated Dec. 15, 2015, from the Japanese Patent Office in counterpart application No. 2015-004522.

* cited by examiner

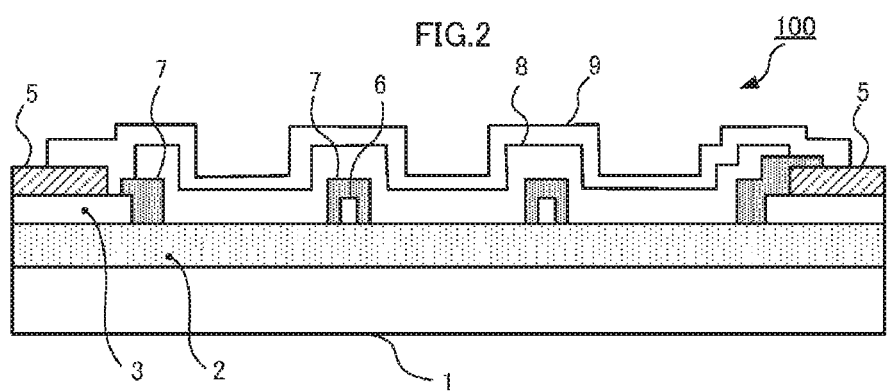
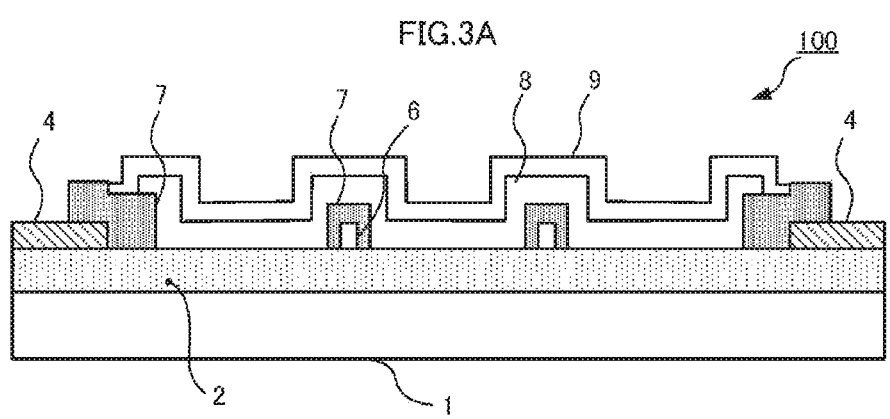
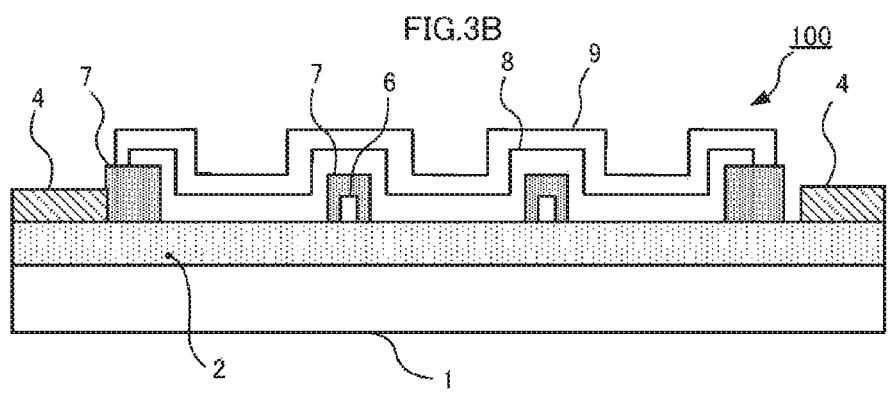

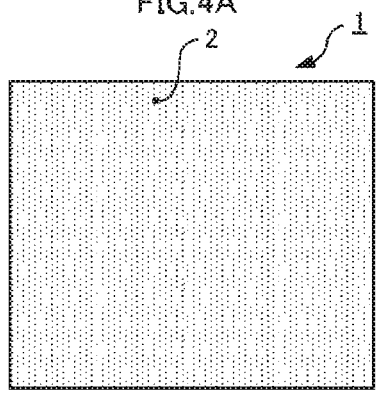
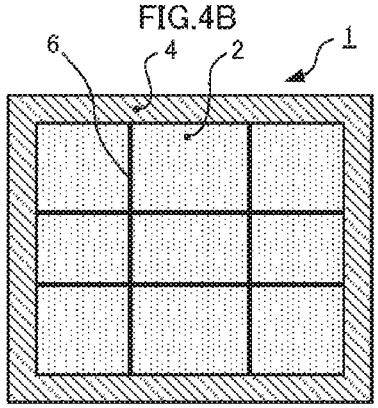
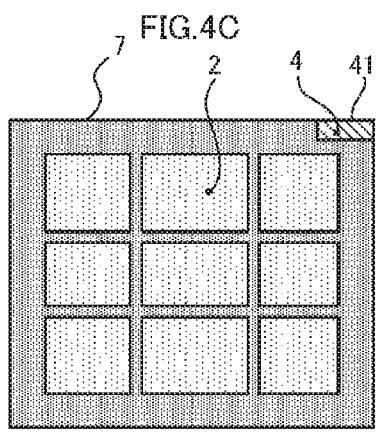
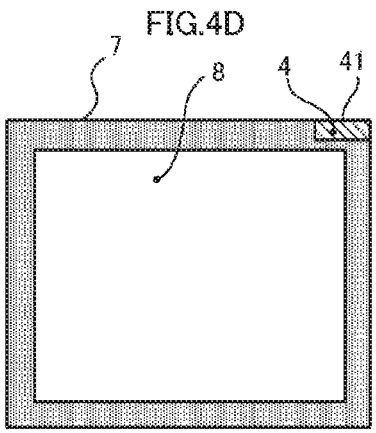
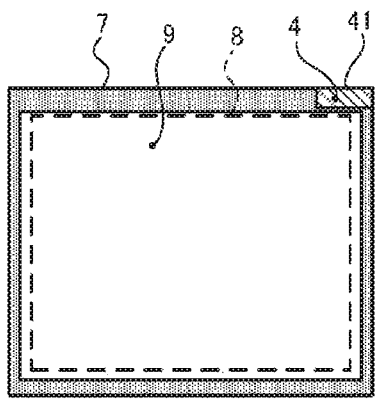
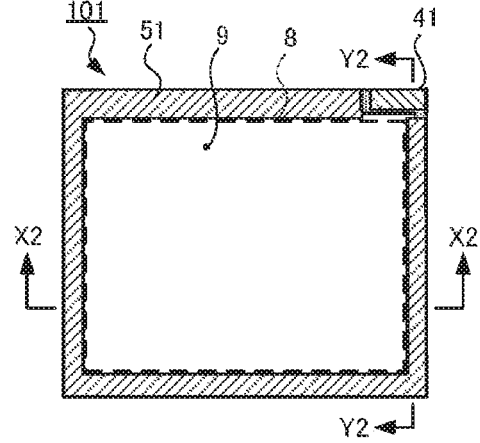

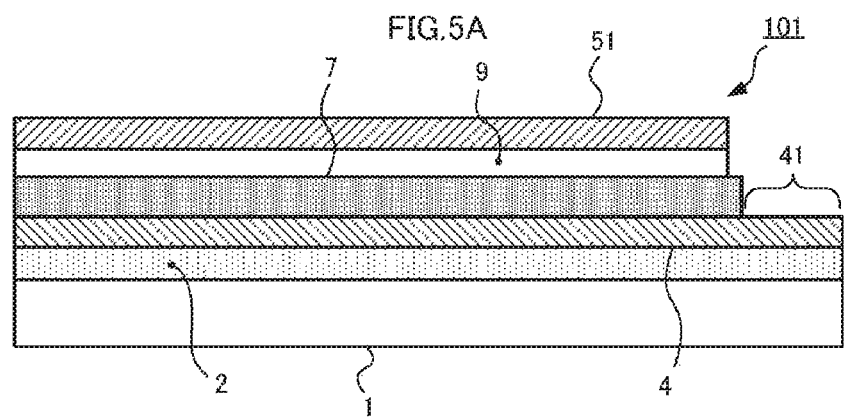
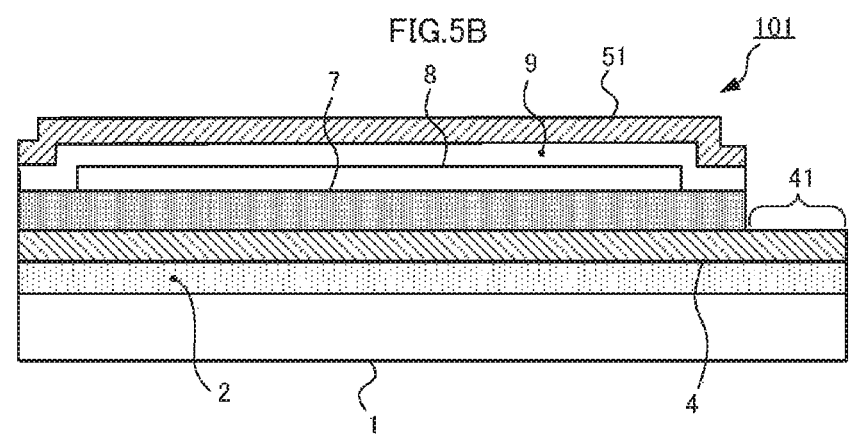
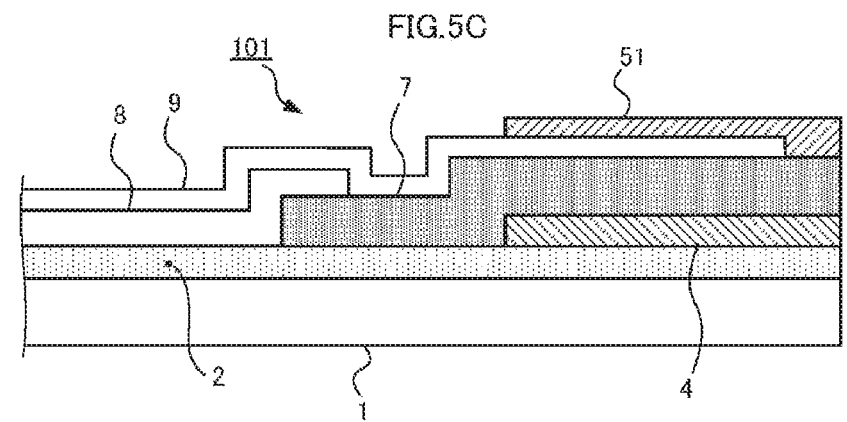

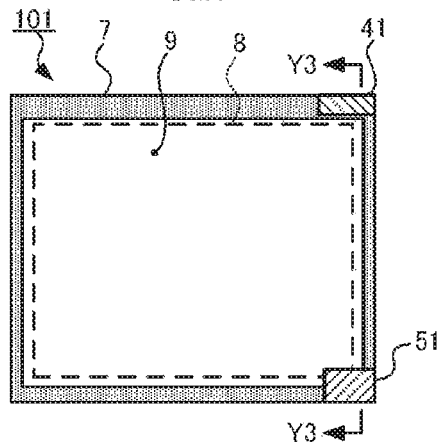
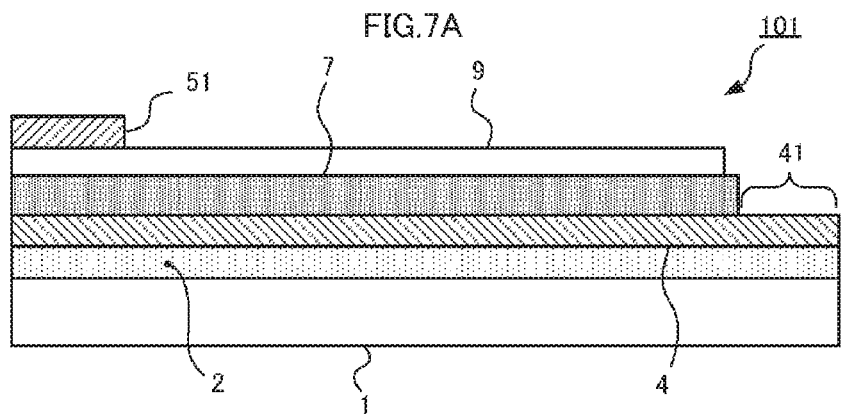
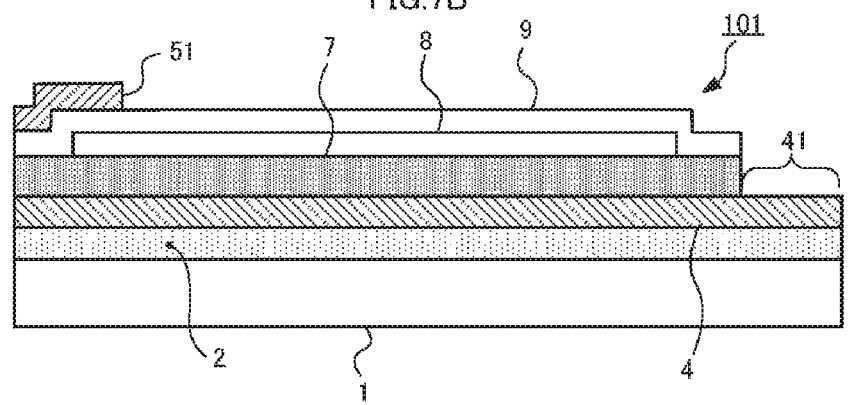

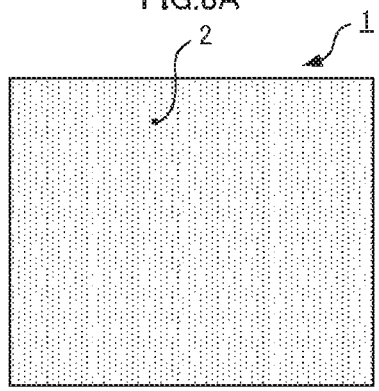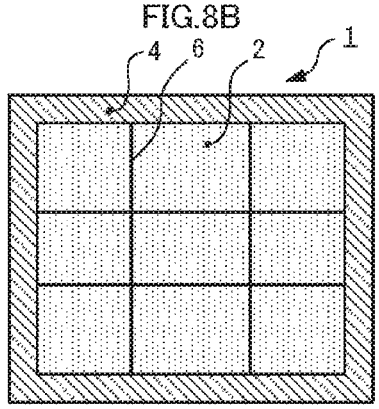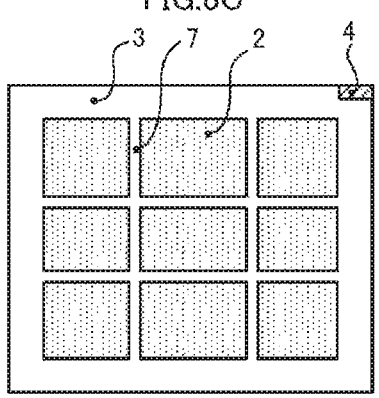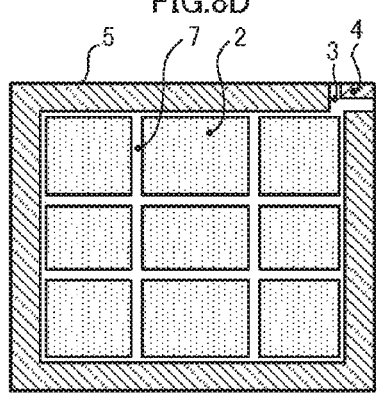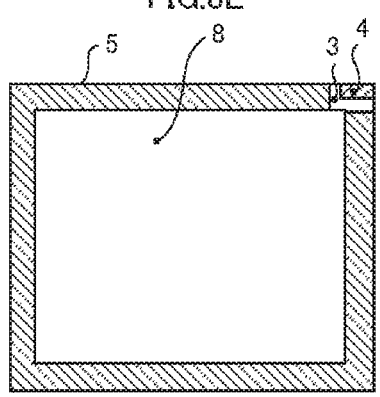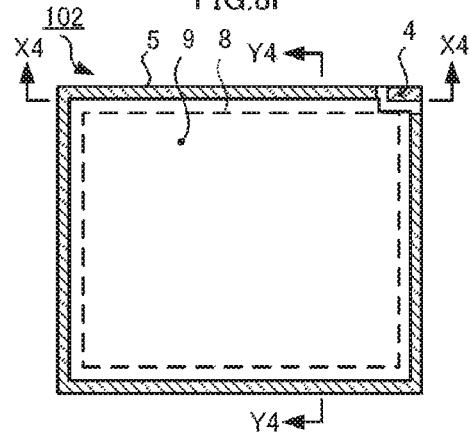

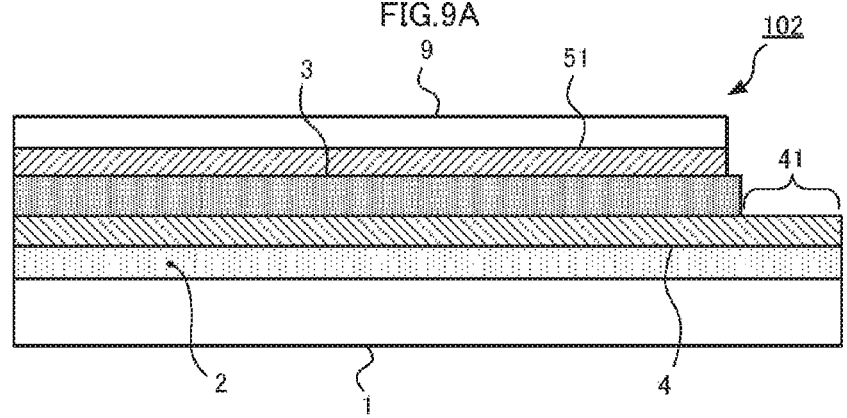
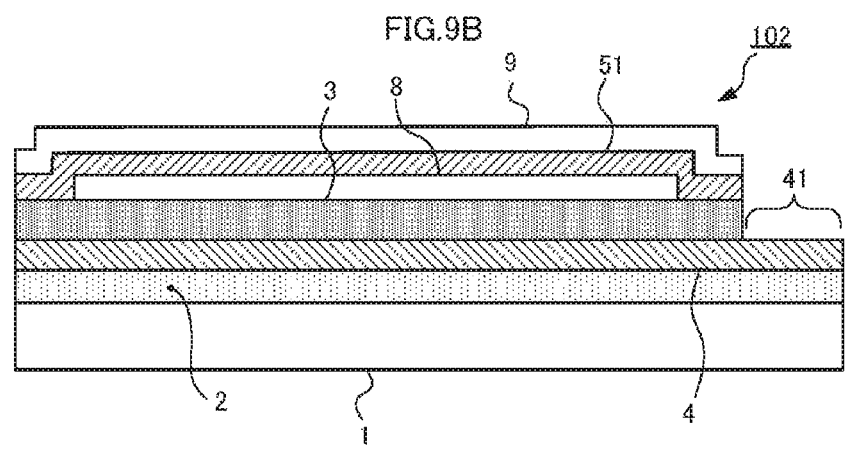
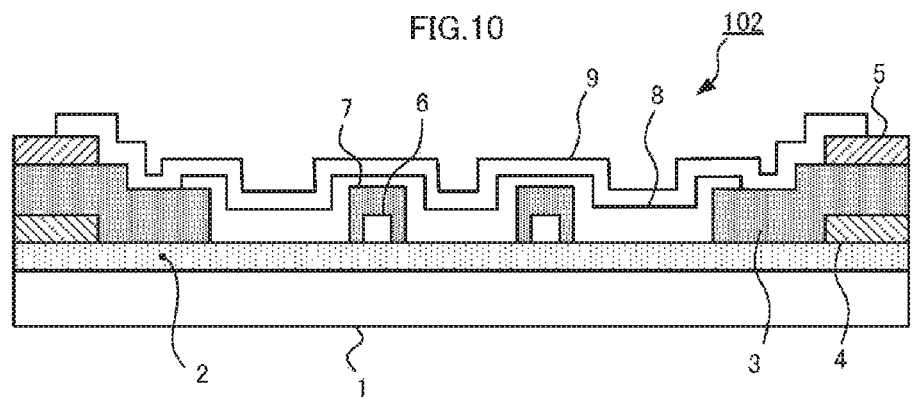

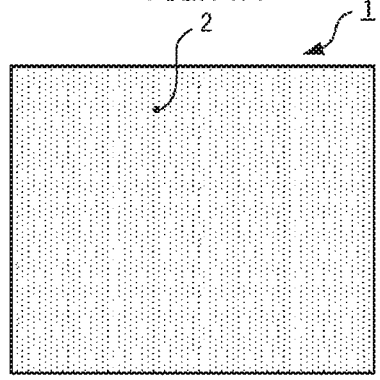
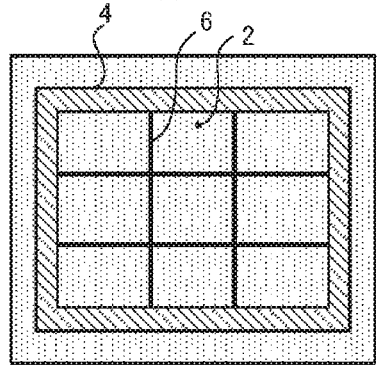
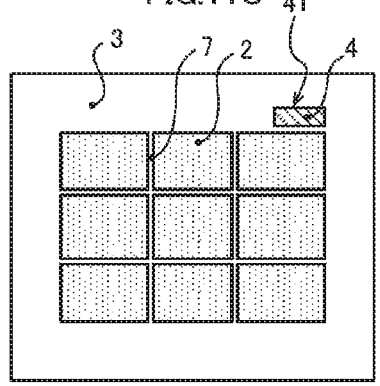
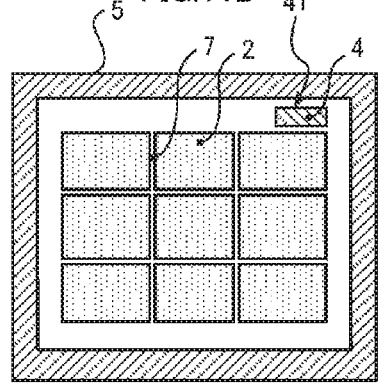
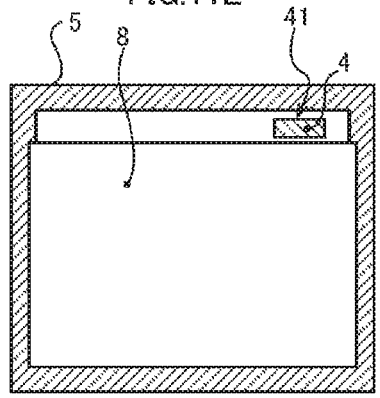
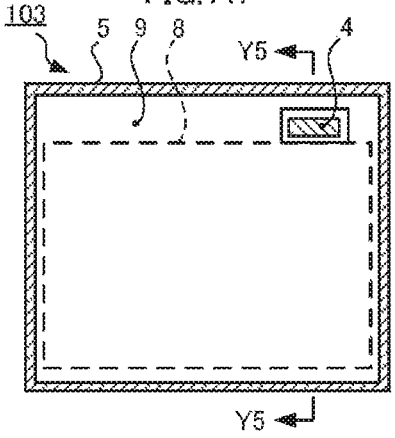

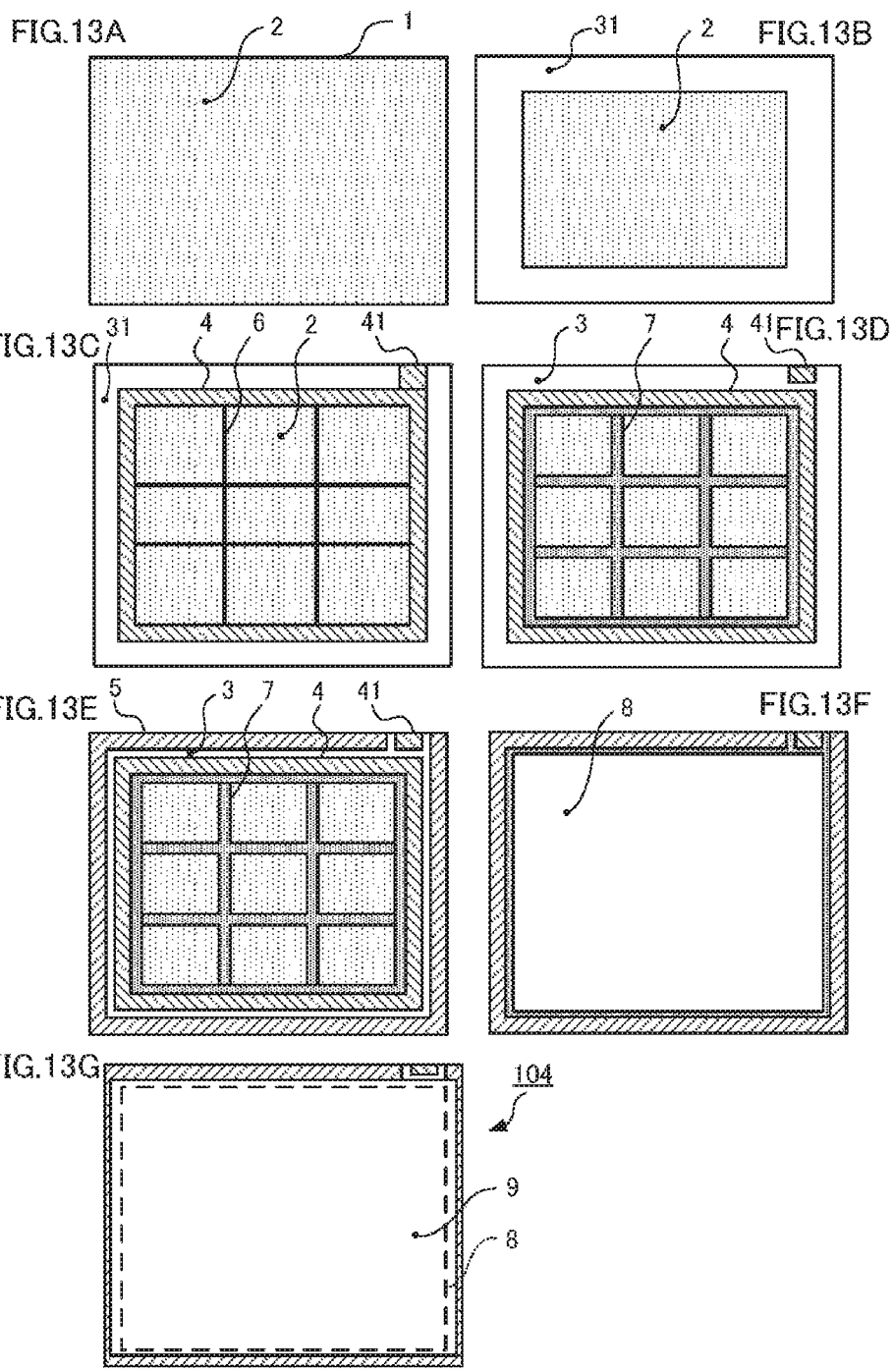

ORGANIC EL LIGHT EMITTING DEVICE, MANUFACTURING METHOD THEREFOR, AND ORGANIC EL ILLUMINATION DEVICE

CROSS-REFERENCE TO RELATED APPLICATIONS

This application is a Continuation of U.S. patent application Ser. No. 14/595,414 filed on Jan. 13, 2015, which is a divisional of U.S. patent application Ser. No. 14/008,461, filed on Sep. 27, 2013, now U.S. Pat. No. 8,963,144 issued Feb. 24, 2015, which is a National Stage of International Application No. PCT/JP2012/058490, filed on Mar. 29, 2012, which claims priority from Japanese Patent Application No. 2011-073273 filed Mar. 29, 2011, the contents of all of which are incorporated herein by reference in their entirety.

TECHNICAL FIELD

The present invention relates to an organic EL light emitting device, a method for manufacturing an organic EL light emitting device and an organic EL illumination device.

BACKGROUND ART

An illumination device having a light emitting device using organic electroluminescence (hereinafter, referred to as "organic EL") is increasingly used. For example, the device is put to practical use for a cell-phone display. Compared with conventional illumination devices such as a fluorescent lamp, the illumination device using organic EL has advantages that it has energy-saving property, that it has low heat generating property, that it is thin and lightweight, and that it is environmentally friendly. Since the illumination device using organic EL is a surface light source, a wide range illumination is capable of being attained, or the device becomes flexible when a plastic substrate is used, and therefore the device is capable of being applied to an illumination device which is excellent in design. For this reason, organic EL is being expected as not only illumination device for housing, offices, or vehicles, but also for decorative illumination, or POP illumination.

As an organic EL light emitting device, for example, in Patent Literature 3, planar light emitting device in which luminance unevenness is capable of being reduced, and the area of non-light emitting portion is capable of being reduced is described. In this technique, the distance between predetermined two parallel sides of four sides of a rectangle light emitting portion constituted by a region where only an organic layer is interposed between an planar anode and a planar cathode and the outer circumferential edges of a transparent substrate is smaller than the distance between other two parallel sides of the four sides and the transparent substrate, a cathode power supplying portion and an anode power supplying portion are arranged along the other two parallel sides of the light emitting portion, and anode power supplying portions are arranged on both sides of the cathode power supplying portion in the width direction.

Patent Literature 1 describes an organic EL element in which takeoff terminals of an anode and a cathode are arranged on a short side of a transparent substrate and which has a light emitting region the width of electrode wiring pattern is narrow. Further, Patent Literature 2 describes an organic EL element in which a cathode has a smaller electric resistance than that of an anode, and in which by making the area of the surface of an anode terminal which is connected to the outside larger than that of the surface of a cathode terminal which is connected to the outside, thereby reducing luminance unevenness.

CITATION LIST

Patent Literature

Patent Literature 1: Unexamined Japanese Patent Application Kokai Publication No. 2001-244069
Patent Literature 2: Unexamined Japanese Patent Application Kokai Publication No. 2009-259413
Patent Literature 3: Unexamined Japanese Patent Application Kokai Publication No. 2010-198980

SUMMARY OF INVENTION

Technical Problem

In a general process for manufacturing an organic EL light emitting element of related art, a transparent conductive electrode film made of, for example, ITO (Indium Tin Oxide; indium tin oxide), an electrode, an interlayer insulating film, and a photosensitive organic insulator are successively formed on a substrate. However, the surface of ITO or the edge of ITO is roughened by etching treatment during the process, or short circuiting occurs during the use thereof, which has been causes of a failure. There also have been a problem of very high cost due to a complex process.

In the organic EL light emitting device, a voltage is applied from a positive electrode and a negative electrode to inject carriers to emit light. In cases where an organic EL light emitting device is used for an illumination device having a panel shape, since each side of the panel is generally used for an electrode portion in order to stably apply a voltage on the device, an electrode takeoff portion is required to be formed on each side, and the portion has been a non-light emitting portion. As the result, when an organic EL light emitting device is utilized for an illumination device, decrease in the total luminous flux or decrease in illuminance is caused due to a panel having a so-called large frame and having a low aperture ratio, and thus the illumination device has a disadvantage compared with other light sources. Other than the case in which an organic EL light emitting device is used for illumination, this holds true also for cases where an organic EL light emitting device is used for a backlight for such as a bulletin board or an advertising display, or cases where an organic EL light emitting device is used for an illumination device having a curved surface shape.

The present invention has been made in view of the above, and an objective of the present invention is to provide an organic EL light emitting device which is manufactured in a simple process and whose aperture ratio is capable of being increased, a manufacturing method of the organic EL light emitting device, and an organic EL illumination device.

Solution to Problem

An organic EL light emitting device relating to a first aspect of the present invention comprises
a transparent substrate,
a transparent electrode film formed on the substrate,
a positive electrode contact portion which is electrically connected to the transparent electrode film as a part of the transparent electrode film, an insulating layer formed on the transparent electrode film such that a light emitting portion is opened, an organic light emitting layer formed on the transparent electrode film and on the insulating layer, a negative electrode layer formed on the organic light emitting layer, a negative electrode contact portion which is in contact with at least part of the negative electrode layer and which is electrically connected to the negative electrode layer, and a protective layer which, in order to separate and electrically insulate the transparent electrode film and the positive electrode contact portion from the negative electrode contact portion, is formed therebetween, wherein the positive electrode contact portion and the negative electrode contact portion are electrically insulated by the insulating layer or the protective layer; and the transparent electrode film is formed without a gap across an area on the substrate including areas where the positive electrode contact portion, the insulating layer, the organic light emitting layer, the negative electrode layer, the negative electrode contact portion and the protective layer are formed.

A manufacturing method of an organic EL light emitting device relating to a second aspect of the present invention comprises forming a transparent electrode film on a transparent substrate, forming a positive electrode contact portion which is electrically connected to the transparent electrode film as a part of the transparent electrode film, forming a negative electrode contact portion on a part of upper side of the transparent electrode film such that the negative electrode contact portion is separated from the transparent electrode film and the positive electrode contact portion, forming an insulating layer on the transparent electrode film such that a light emitting portion is opened, forming an organic light emitting layer on the transparent electrode film and on the insulating layer, and forming a negative electrode layer which is electrically connected to the negative electrode contact portion on the organic light emitting layer such that the negative electrode layer is separated from the transparent electrode film and the positive electrode contact portion, and further comprises before the forming a negative electrode contact portion, forming a protective layer for electrically insulating the transparent electrode film and the positive electrode contact portion from the negative electrode contact portion between the transparent electrode film and the positive electrode contact portion, and the negative electrode contact portion.

An organic EL illumination device relating to a third aspect of the present invention is characterized by comprising the organic EL light emitting device relating to the first aspect of the present invention.

An organic EL illumination device relating to a fourth aspect of the present invention is characterized by comprising an organic EL light emitting device manufactured by the manufacturing method of an organic EL light emitting device relating to the second aspect of the present invention.

Advantageous Effects of Invention

By the present invention, the process becomes simple and the aperture ratio is capable of being increased.

BRIEF DESCRIPTION OF DRAWINGS

FIG. 2 is a configuration cross section of an organic EL light emitting device relating to Embodiment 1, illustrating a cross section taken along line X1-X1 in FIG. 1F;

FIG. 3A is a configuration cross section of an organic EL light emitting device relating to Embodiment 1, illustrating a cross section taken along line Y1-Y1 in FIG. 1F;

FIG. 3B is a configuration cross section illustrating a modification of the organic EL light emitting device illustrated in FIG. 3A;

FIG. 4A is a configuration plan view illustrating one example of a manufacturing process of an organic EL light emitting device relating to Embodiment 2 of the present invention;

FIG. 4B is a configuration plan view illustrating one example of a manufacturing process of an organic EL light emitting device relating to Embodiment 2 of the present invention;

FIG. 4C is a configuration plan view illustrating one example of a manufacturing process of an organic EL light emitting device relating to Embodiment 2 of the present invention;

FIG. 4D is a configuration plan view illustrating one example of a manufacturing process of an organic EL light emitting device relating to Embodiment 2 of the present invention;

FIG. 4E is a configuration plan view illustrating one example of a manufacturing process of an organic EL light emitting device relating to Embodiment 2 of the present invention;

FIG. 4F is a configuration plan view illustrating one example of a manufacturing process of an organic EL light emitting device relating to Embodiment 2 of the present invention;

FIG. 5A is a configuration cross section of an organic EL light emitting device relating to Embodiment 2, illustrating a cross section taken along line Y2-Y2 in FIG. 4F;

FIG. 5B is a configuration cross section of an organic EL light emitting device relating to Embodiment 2, illustrating a cross section taken along line Y2-Y2 in FIG. 4F;

FIG. 5C is a configuration cross section of an organic EL light emitting device relating to Embodiment 2, illustrating a cross section taken along line X2-X2 in FIG. 4F.

FIG. 6 is a configuration cross section illustrating another configuration of an organic EL light emitting device relating to Embodiment 2;

FIG. 7A is a configuration cross section of another configuration of an organic EL light emitting device relating to Embodiment 2, illustrating a cross section taken along line Y3-Y3 in FIG. 6;

FIG. 7B is a configuration cross section of another configuration of an organic EL light emitting device relating to Embodiment 2, illustrating a cross section taken along line Y3-Y3 in FIG. 6;

FIG. 8A is a configuration plan view illustrating one example of a manufacturing process of an organic EL light emitting device relating to Embodiment 3 of the present invention;

FIG. 8B is a configuration plan view illustrating one example of a manufacturing process of an organic EL light emitting device relating to Embodiment 3 of the present invention;

FIG. 8C is a configuration plan view illustrating one example of a manufacturing process of an organic EL light emitting device relating to Embodiment 3 of the present invention;

FIG. 8D is a configuration plan view illustrating one example of a manufacturing process of an organic EL light emitting device relating to Embodiment 3 of the present invention;

FIG. 8E is a configuration plan view illustrating one example of a manufacturing process of an organic EL light emitting device relating to Embodiment 3 of the present invention;

FIG. 8F is a configuration plan view illustrating one example of a manufacturing process of an organic EL light emitting device relating to Embodiment 3 of the present invention;

FIG. 9A is a configuration cross section of an organic EL light emitting device relating to Embodiment 3, illustrating a cross section taken along line X4-X4 in FIG. 8F;

FIG. 9B is a configuration cross section of an organic EL light emitting device relating to Embodiment 3, illustrating a cross section taken along line X4-X4 in FIG. 8F;

FIG. 10 is a configuration cross section of an organic EL light emitting device relating to Embodiment 3, illustrating a cross section taken along line Y4-Y4 in FIG. 8F;

FIG. 11A is a configuration plan view illustrating one example of a manufacturing process of an organic EL light emitting device relating to a modification of Embodiment 3 of the present invention;

FIG. 11B is a configuration plan view illustrating one example of a manufacturing process of an organic EL light emitting device relating to a modification of Embodiment 3 of the present invention;

FIG. 11C is a configuration plan view illustrating one example of a manufacturing process of an organic EL light emitting device relating to a modification of Embodiment 3 of the present invention;

FIG. 11D is a configuration plan view illustrating one example of a manufacturing process of an organic EL light emitting device relating to a modification of Embodiment 3 of the present invention;

FIG. 11E is a configuration plan view illustrating one example of a manufacturing process of an organic EL light emitting device relating to a modification of Embodiment 3 of the present invention;

FIG. 11F is a configuration plan view illustrating one example of a manufacturing process of an organic EL light emitting device relating to a modification of Embodiment 3 of the present invention;

FIG. 13A is a configuration plan view illustrating one example of a manufacturing process of an organic EL light emitting device relating to Embodiment 4 of the present invention;

FIG. 13B is a configuration plan view illustrating one example of a manufacturing process of an organic EL light emitting device relating to Embodiment 4 of the present invention;

FIG. 13C is a configuration plan view illustrating one example of a manufacturing process of an organic EL light emitting device relating to Embodiment 4 of the present invention;

FIG. 13D is a configuration plan view illustrating one example of a manufacturing process of an organic EL light emitting device relating to Embodiment 4 of the present invention;

FIG. 13E is a configuration plan view illustrating one example of a manufacturing process of an organic EL light emitting device relating to Embodiment 4 of the present invention;

FIG. 13F is a configuration plan view illustrating one example of a manufacturing process of an organic EL light emitting device relating to Embodiment 4 of the present invention;

FIG. 13G is a configuration plan view illustrating one example of a manufacturing process of an organic EL light emitting device relating to Embodiment 4 of the present invention;

DESCRIPTION OF EMBODIMENTS

Figure 1A:
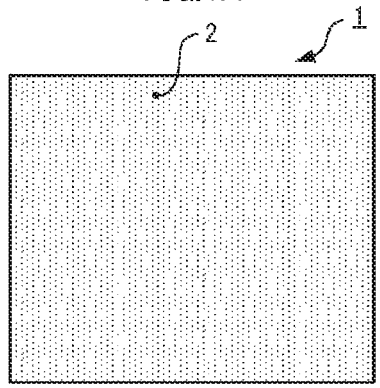
FIG. 1A is a configuration plan view illustrating one example of a manufacturing process of an organic EL light emitting device relating to Embodiment 1 of the present invention.

In the following, organic EL light emitting devices, manufacturing methods of an organic EL light emitting device and organic EL illumination devices relating to Embodiments of the present invention will be described in detail with reference to the Drawings. A like numeral designates a like or corresponding part in figures.

Embodiment 1

FIGS. 1A-1F are configuration plan views illustrating one example of manufacturing processes of an organic EL light emitting device relating to Embodiment 1 of the present invention. FIG. 2 is a configuration cross section of an organic EL light emitting device relating to Embodiment 1, illustrating a cross section taken along line X1-X1 in FIG. 1F. FIG. 3A is a configuration cross section of an organic EL light emitting device relating to Embodiment 1, illustrating a cross section taken along line Y1-Y1 in FIG. 1F. FIG. 3B illustrates a modification of FIG. 3A.

The light emitting principle of an organic EL is such that, by applying a voltage to a cathode and an anode, electrons and holes injected from the cathode and the anode respectively are recombined at a light emitting layer to form excitons to generate an excited state, and when the excited state returns to a low energy level (for example, a ground state), a light is emitted. Here, an excited state having the same electron spin multiplicity as that of a ground state is a singlet excited state; an excited state having different electron spin multiplicity from that of a ground state is a triplet excited state. A light emission is obtained when the excited state returns to a low level, or to a ground state. A fluorescence is obtained when a singlet excited state returns thereto; a phosphorescence is obtained when triplet excited state returns thereto. In cases where the light emitting layer is a binary system of a host and a dopant, by the energy shift from an excited state generated in a host molecule to a dopant molecule, the dopant molecule emits light.

An organic EL light emitting device 100 comprises a substrate 1, a transparent electrode film (positive electrode film) 2, a protective layer 3, a positive electrode contact and a power supplying portion 4 (hereinafter, referred to as "positive electrode contact portion 4"), a negative electrode contact and power supplying portion 5 (hereinafter, referred to as "negative electrode contact portion 5"), an auxiliary electrode 6, an insulating layer 7, an organic light emitting layer 8, and a negative electrode film 9.

In the present Embodiment, the organic EL light emitting device 100 is used for an organic EL illumination device (illumination device) such as a room lamp. The organic EL light emitting device 100 is not limited for an illumination device, and is usable for a variety of applications such as information display panel for a bulletin board, advertising or the like, a backlight for a display for an image or a liquid crystal display, a display device for home appliances or the like.

The positive electrode contact and power supplying portion 4 serves as the positive electrode contact portion 4 and a power supplying portion which supplies power to the organic light emitting layer 8 via the positive electrode contact portion 4. Similarly, the negative electrode contact and power supplying portion 5 serves as a negative electrode contact portion 5 and a power supplying portion which supplies power to the organic light emitting layer 8 via negative electrode contact portion 5.

The substrate 1 is formed from a material such as a non-alkali glass. A material such as PEN (polyethylene naphthalate), which is a resin substrate having flexibility, is also usable.

The transparent electrode film 2 is formed of, for example, indium tin oxide (ITO), and formed on substantially the whole surface of the substrate 1 by sputtering in a state in which there is no gap. The term "substantially the whole surface of the substrate 1" refers to a whole area including areas where the protective layer 3, the positive electrode contact portion 4, the negative electrode contact portion 5, the auxiliary electrode 6, the insulating layer 7, the organic light emitting layer 8, and negative electrode film 9 are formed. In other words, the transparent electrode film 2 is formed on the whole region including, in a planar view, at least a region (area) where the protective layer 3, the positive electrode contact portion 4, the negative electrode contact portion 5, the auxiliary electrode 6, the insulating layer 7, the organic light emitting layer 8, and the negative electrode film 9 are formed on the substrate 1. It is possible that the transparent electrode film 2 be formed covering the whole surface to the ends of the substrate 1 without a gap or be formed without covering to the ends of the substrate 1. On a lower side of at least the protective layer 3, the positive electrode contact portion 4, the negative electrode contact portion 5, the auxiliary electrode 6, the insulating layer 7, the organic light emitting layer 8, and the negative electrode film 9, the transparent electrode film 2 is formed. It is possible that the transparent electrode film 2 is formed by other physical vapor depositions (PVD: Physical Vapor Deposition) such as a vacuum vapor deposition. In the present Embodiment, a usable film thickness of the transparent electrode film 2 is, for example, 100 to 300 nm.

The protective layer 3 is formed on the transparent electrode film 2 or the like, and is used for forming a base for lift-up while insulating between the layers each other. The protective layer 3 also functions as a planarizing film for the underlayer of the protective layer 3. For the protective layer 3, an inorganic material film such as a photoresist material having photosensitivity such as novolac, acrylic, or polyimide material, a silicon nitride film (SiNx) film or a silicon oxide (SiOx) film. It is possible to form the protective layer 3 by, after the application, being subjected to patterning by photolithography, or using vacuum vapor deposition or chemical vapor deposition (CVD: Chemical Vapor Deposition) and patterning by shadow mask or photoetching.

Specifically, the protective layer 3 is formed by forming the transparent electrode film 2 on the substrate 1 and forming the negative electrode contact portion 5 on the protective layer 3. At this time, since the height of the positive electrode contact portion 4 and the height of the negative electrode contact portion 5 when they are formed are different, the portions are easily arranged while keeping the electrical insulation therebetween. The term "height when formed" refers to the position of the layer of each of the positive electrode contact portion 4 and the negative electrode contact portion 5 from the substrate 1. The phrase "the height of the positive electrode contact portion 4 and the height of the negative electrode contact portion 5 when they are formed are different" is hereinafter referred to as "the positive electrode contact portion 4 and the negative electrode contact portion 5 are formed in different layers". The phrase also includes "the positive electrode contact portion 4 and the negative electrode contact portion 5 are formed in a different process step (order).

Figure 1B:
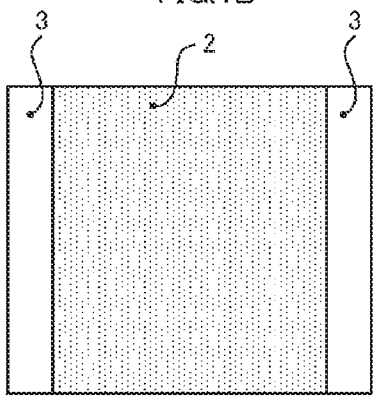
FIG. 1B is a configuration plan view illustrating one example of a manufacturing process of an organic EL light emitting device relating to Embodiment 1 of the present invention.
Figure 1C:
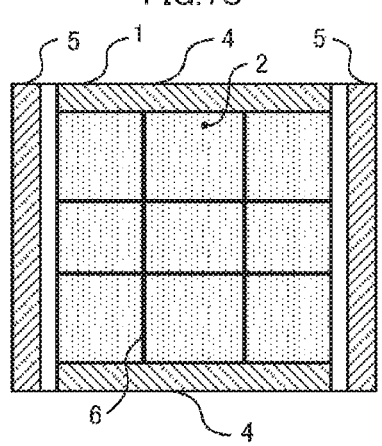
FIG. 1C is a configuration plan view illustrating one example of a manufacturing process of an organic EL light emitting device relating to Embodiment 1 of the present invention.

By forming the protective layer 3 such that the width thereof is wider than that of the negative electrode contact portion 5, it is possible to easily and surely separate the positive electrode contact portion 4 from the negative electrode contact portion 5. As illustrated in FIG. 1B, the protective layer 3 is formed on the both end portions of the transparent electrode film 2 at opposing positions such that the layer rims the organic EL light emitting device 100. In the present Embodiment, since the substrate 1 is rectangle, the protective layer 3 is formed along the opposing sides on the right and left. On the end portion of the transparent electrode film 2 on which side the protective layer 3 is formed, the negative electrode contact portion 5 is formed. In the present Embodiment, the negative electrode contact portion 5 is formed such that a gap is formed on the protective layer 3 at a center portion of the transparent electrode film 2. As illustrated in FIG. 1C and FIG. 2, the negative electrode contact portion 5 is formed such that the width thereof is narrower than that of the protective layer 3, and such that the portion recedes a predetermined distance more from the center of the transparent electrode film 2 compared with the protective layer 3. By forming the negative electrode contact portion 5 having a narrower width than that of the protective layer 3 on the protective layer 3, it is possible to easily separate the positive electrode contact portion 4 from the negative electrode contact portion 5 even when the portion is not formed with high precision. In the present Embodiment, when a resist material is used for the protective layer 3, a usable film thickness thereof is, for example, 500 to 1500 nm.

The positive electrode contact portion 4 is electrically connected to the transparent electrode film 2, and injects the holes supplied to the organic EL light emitting device 100 into the transparent electrode film 2 via the positive electrode contact portion 4. For example, the positive electrode contact portion 4 is formed, for example, as illustrated in FIG. 1C, in an opposed manner on the ends on the sides on which the protective layer 3 is not formed on the transparent electrode film 2. In the present Embodiment, the positive electrode contact portion 4 is formed, as illustrated in FIG. 1C, along the opposing sides on the upper side and the lower side.

For the positive electrode contact portion 4, a metal material such as Cr (chromium), Mo—Nd (molybdenum-neodymium), or Mo—Al—Mo (molybdenum-aluminium-molybdenum) is used. The positive electrode contact portion 4 is formed by a method such as sputtering using a shadow mask or the like, and alternatively, it is possible to perform photoetching after the whole surface is formed with the film.

The negative electrode contact portion 5 is electrically connected to the negative electrode film 9, and injects the electrons supplied to the organic EL light emitting device 100 into the negative electrode film 9 via the negative electrode contact portion 5. The negative electrode contact portion 5 is formed on the protective layer 3 which has been formed on the transparent electrode film 2 in advance. The protective layer 3 is a base for lift-up, and is used for forming the negative electrode contact portion 5 and the positive electrode contact portion 4 in different layers so that the negative electrode contact portion 5 is not electrically connected to the positive electrode contact portion 4.

At this time, since the protective layer 3 also serves as an interlayer insulator, the positive electrode contact portion 4 and the negative electrode contact portion 5 which are positioned over and under the protective layer 3 do not short. Since the positive electrode contact portion 4 and the negative electrode contact portion 5 are formed in different layers, the transparent electrode film 2 which is connected to the positive electrode contact portion 4 and the negative electrode film 9 which is connected to the negative electrode contact portion 5 are capable of being arranged not to easily be electrically in contact with each other.

For the negative electrode contact portion 5, the same metal material as that of the positive electrode contact portion 4 can be used. The negative electrode contact portion 5 is formed by a method such as sputtering using a shadow mask or the like, and alternatively, it is possible to perform photoetching after the whole surface is formed with the film. It is possible to form the positive electrode contact portion 4 and the negative electrode contact portion 5 altogether in the same process at the same time, resulting in no increase in the number of process steps, thereby reducing the load of process.

The auxiliary electrode 6 is electrically connected to the positive electrode contact portion 4 via the transparent electrode film 2 or directly. For the auxiliary electrode 6, a metal material such as Cr (chromium), Mo—Nd (molybdenum-neodymium), Mo—Al—Mo (molybdenum-aluminium-molybdenum) is used. The auxiliary electrode 6 is formed on the transparent electrode film 2 by a method such as sputtering using a shadow mask or the like. It is possible to form the auxiliary electrode 6 by performing photoetching in an arbitrary shape after a film is formed of a metal material. The auxiliary electrode 6 is electrically connected to the positive electrode contact portion 4 directly or via the transparent electrode film 2. In the present Embodiment, there is exemplified an example formed in gridlike fashion for the auxiliary electrode 6, but the shape of the auxiliary electrode 6 is not limited thereto.

Regarding the positive electrode contact portion 4, by using the same metal material as that of the auxiliary electrode 6, it is possible to form the positive electrode contact portion 4 and the auxiliary electrode 6 altogether in the same process at the same time, resulting in no increase in the number of process steps, thereby reducing the load of process. It is possible to form the positive electrode contact portion 4 and the auxiliary electrode 6 at the same time by a method such as sputtering, or photoetching in an arbitrary shape after a film is formed of a metal material.

It is possible to form the positive electrode contact portion 4 and the auxiliary electrode 6, as well as the negative electrode contact portion 6 at the same time. It is possible to easily form the positive electrode contact portion 4 and the negative electrode contact portion 5 at the same time since the protective layer 3 and/or the below-mentioned insulating layer 7 serve as a mask to surely separate the portions. The portions are formed at the same time and it is possible to reduce the number of process steps.

It is not necessary to form the positive electrode contact portion 4 and the negative electrode contact portion 5 at the same time even the same material is used since the heights of the points where the portions are formed from the substrate 1 are different. In the present Embodiment, usable film thicknesses of the positive electrode contact portion 4, the negative electrode contact portion 5 and the auxiliary electrode 6 are, for example, 200 to 1000 nm.

The organic EL light emitting device 100 emits light at a light emitting surface by injection of electrons and holes into a light emitting element and the recombination of the electrons and holes. The auxiliary electrode 6 moderates the voltage drop due to the wiring resistance of the transparent electrode film 2 having a high sheet resistance, which makes easy uniform hole supply to the light emitting surface of the organic EL light emitting device 100, thereby inhibiting in-plane luminance variation and maintain stable light emission.

Figure 1D:
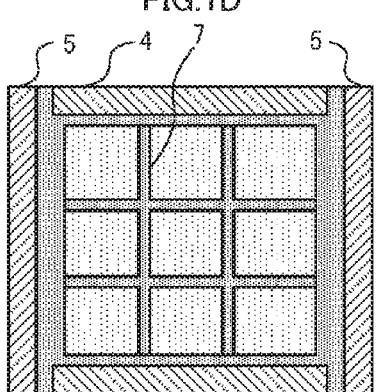
FIG. 1D is a configuration plan view illustrating one example of a manufacturing process of an organic EL light emitting device relating to Embodiment 1 of the present invention.

The insulating layer 7 is formed along the positive electrode contact portion 4 and the negative electrode contact portion 5, and further formed between the positive electrode contact portion 4 and the negative electrode contact portion 5 and on the auxiliary electrode 6. The insulating layer 7 is formed such that a light emitting portion is opened in order to make the light emitting portion of the organic EL light emitting device 100 into a predetermined shape. For example, as illustrated in FIG. 1D, a portion formed along the positive electrode contact portion 4 and the negative electrode contact portion 5 forms an opening, and the region inside the opening is a light emitting portion of the organic EL light emitting device 100. A part of the insulating layer 7 is formed in gridlike fashion so that the auxiliary electrode 6 is further covered inside the opening. Further, the insulating layer 7 also serves as a planarizing film for the lower layer. For the insulating layer 7, the same material as the protective layer 3 is employable, and a photoresist material having photosensitivity such as novolac, acrylic, polyimide material, an inorganic material film such as silicon nitride (SiNx) film or a silicon oxide (SiOx) film. The insulating layer 7 is capable of being formed by, after application, being subjected to patterning by photolithography or being subjected to using vacuum vapor deposition or chemical vapor deposition (CVD: Chemical Vapor Deposition) and patterning by shadow mask or photoetching. In the present Embodiment, the usable film thickness when a resist material is used for the insulating layer 7 is, for example, 500 to 1500 nm; and the usable film thickness when an inorganic material is used is, for example, 200 to 600 nm.

The organic light emitting layer 8 serves as a light emitting layer, and formed on the transparent electrode film 2 where the insulating layer 7 is not formed and on the insulating layer 7. At this time, it is possible that a part of the organic light emitting layer 8 is formed on the insulating layer 7 as long as the organic light emitting layer 8 is formed on a portion surrounded by the insulating layer 7. Since the insulating layer 7 serves as a mask, patterning is capable of being performed in a self alignment manner. The organic light emitting layer 8 is formed in any manner as long as there is no risk of electrically connecting the transparent electrode film 2 and the negative electrode contact portion 5 directly via the organic light emitting layer 8. At this time, the organic light emitting layer 8 is preferably provided with a hole injection/transport layer such as triphenyl amine derivatives on the transparent electrode film 2. It is possible that the organic light emitting layer 8 is further provided with an electron transport layer such as triazole derivatives between the organic light emitting layer 8 and the negative electrode film 9.

The negative electrode film 9 is formed on the organic light emitting layer 8. The negative electrode film 9 is electrically connected to the negative electrode contact portion 5, and injects the electrons supplied to the organic EL light emitting device 100 into the negative electrode film 9 via the negative electrode contact portion 5. The negative electrode film 9 is formed of a metal material such as Al (aluminium). At this time, the negative electrode film is formed on an electron injection layer such as LiF (lithium fluoride) which has been provided in advance. In the present Embodiment, the usable film thickness of negative electrode film 9 is, for example, 50 to 300 nm.

It is possible to supply power to the negative electrode layer 9 at anywhere from a power source. It is also possible to supply power from four directions by forming the film such that the outer periphery portion of the negative electrode film 9 is thick.

When the organic light emitting layer 8 is provided with, a hole injection layer, a hole transport layer, and a electron transport layer other than the light emitting layer, it is desired that the transparent electrode film 2, a hole injection layer, a hole transport layer, a light emitting layer, and a electron transport layer be successively formed. In order to improve the recombination probability to improve the luminescence quantum efficiency, it is possible to use a hole blocking layer between a light emitting layer and an electron transport layer. Further, the organic light emitting layer 8 is not limited to be constituted by one light emitting layer, and it is also possible that the organic light emitting layer 8 is constituted by two light emitting layers. The constitution of the organic light emitting layer 8 is appropriately changed. When the light emitting layer serves as a hole injection/transport layer, the transparent electrode film 2, it is possible that the light emitting layer, and a electron transport layer are formed in the order mentioned. When the light emitting layer serves as an electron transport layer, the transparent electrode film 2, a hole injection/transport layer, and a light emitting layer are formed in the order mentioned. It is possible that the organic light emitting layer 8 is constituted by one layer including only a light emitting layer. In the present Embodiment, the usable total film thickness of the organic light emitting layer 8 is, for example, 100 to 500 nm.

In the following, the manufacturing method of the organic EL light emitting device 100 will be described in detail. First, as illustrated in FIG. 1A, the transparent electrode film 2 is formed by a transparent conductive material such as indium tin oxide (no) uniformly on substantially the whole surface of the substrate 1 formed of a material such as non-alkali glass. The formation of the transparent electrode film 2 is performed by physical vapor deposition (PVD) such as sputtering or vacuum vapor deposition.

Next, on opposing side edge portions of the transparent electrode film 2, the protective layer 3 is formed (see FIG. 1B). By this protective layer 3, a base which is lifted up from the transparent electrode film 2 is formed and it becomes possible to form the negative electrode contact portion 5 formed in FIG. 1C and the positive electrode contact portion 4 in different layers to easily separate a positive electrode from a negative electrode.

In FIG. 1C, the negative electrode contact portion 5 is formed on the protective layer 3, and the positive electrode contact portion 4 is formed on opposing side edge portions of the transparent electrode film 2 where the protective layer 3 is not formed. On the transparent electrode film 2, the auxiliary electrode 6 is formed. The positive electrode contact portion 4, the negative electrode contact portion 5 and the auxiliary electrode 6 are formed by sputtering a metal material such as Cr (chromium), Mo—Nd (molybdenum-neodymium) and Mo—Al—Mo (molybdenum-aluminium-molybdenum) by using a shadow mask or the like. It is also possible to perform photoetching after a film is formed of a metal material.

At this time, the organic EL light emitting device 100 is formed such that the organic EL light emitting device 100 is electrically connected to a power source which is connected to the outside of the organic EL light emitting device 100 via the positive electrode contact portion 4; similarly, the organic EL light emitting device 100 is formed such that the organic EL light emitting device 100 is electrically connected to a power source which is connected to the outside of the organic EL light emitting device 100 via the negative electrode contact portion 5. The protective layer 3 is formed in advance, and the negative electrode contact portion 5 is form thereon, whereby the positive electrode contact portion 4 and the negative electrode contact portion 5 are formed in different layers, which makes easy to electrically insulate the positive electrode contact portion 4 and the negative electrode contact portion 5 each other.

In FIG. 1D, in order to perform patterning, the insulating layer 7 is formed integrally at the same time, for example, by photoresist. The insulating layer 7 is formed on the auxiliary electrode 6. The insulating layer 7 covers other than the light emitting surface to fit the light emitting shape of the organic EL light emitting device 100. Further, the insulating layer 7 is formed between the positive electrode contact portion 4 and the negative electrode contact portion 5, and between the transparent electrode film 2 and the negative electrode contact portion 5, respectively, to maintain insulation and prevent short circuiting.

It is also possible that the insulating layer 7 is formed of a photoresist which is a material having photosensitivity, and it is also possible that the insulating layer 7 is formed by making a film by a material for inorganic layer such as SiNx or SiOx by vacuum vapor deposition or a CVD method, and then being subjected to patterning by shadow mask or photoetching.

Figure 1E:
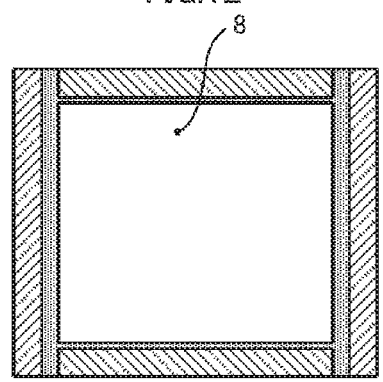
FIG. 1E is a configuration plan view illustrating one example of a manufacturing process of an organic EL light emitting device relating to Embodiment 1 of the present invention.

Subsequently, as illustrated in FIG. 1E, on the transparent electrode film 2 on which the insulating layer 7 is formed in FIG. 1D, the organic light emitting layer 8 is formed. The organic light emitting layer 8 is formed such that the transparent electrode film 2 and the negative electrode contact portion 5 are not electrically connected directly via the organic light emitting layer 8. At this time, it is possible that the organic light emitting layer 8 is formed such that a part of the organic light emitting layer 8 is laid on the insulating layer 7 having a predetermined width which is formed to cover the outer periphery of the transparent electrode film 2, for example, a part of the organic light emitting layer 8 is laid surroundingly on the insulating layer 7. The insulating layer 7 serves as a mask, which eliminates the need for a shadow mask requiring a high alignment precision, and makes the process simple. As illustrated in FIG. 2 and FIG. 3, it is possible that the organic light emitting layer 8 is formed on the insulating layer 7 having a width, which eliminates the need for high precision positioning.

FIG. 3B is a configuration cross section of the organic EL light emitting device, which is a variation of the configuration cross section of the organic EL light emitting device illustrated in FIG. 3A. In FIG. 3A, the organic EL light emitting device 100 is formed such that the insulating layer 7 covers a part of the positive electrode contact portion 4; as illustrated in FIG. 3B, it is also possible that the positive electrode contact portion 4 and the insulating layer 7 are adjacently formed. As illustrated in the right side of FIG. 3B, it is possible that there is formed a gap between the positive electrode contact portion 4 and the insulating layer 7.

Figure 1F:
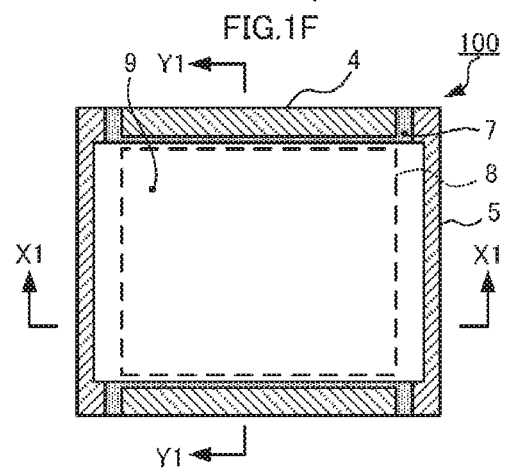
FIG. 1F is a configuration plan view illustrating one example of a manufacturing process of an organic EL light emitting device relating to Embodiment 1 of the present invention.

In FIG. 1F, on the organic light emitting layer 8, the negative electrode film 9 is formed to complete the manufacturing process of the organic EL light emitting device 100. The negative electrode film 9 is, as illustrated in FIG. 2, formed to cover a part of the negative electrode contact portion 5 such that the negative electrode film 9 is electrically connected to a power source which is connected to the outside of the organic EL light emitting device 100 via the negative electrode contact portion 5. The negative electrode film 9 is formed such that the negative electrode film 9 is not in direct contact with the positive electrode contact portion 4, and further, such that the negative electrode film 9 is not electrically connected to the positive electrode contact portion 4. At this time, it is possible that the negative electrode film 9 is formed such that a part of the negative electrode film 9 is laid on the insulating layer 7 having a predetermined width which is formed to cover the outer periphery of the transparent electrode film 2, for example, a part of the negative electrode film 9 is laid surroundingly on the insulating layer 7. The insulating layer 7 serves as a mask, which eliminates the need for a shadow mask requiring a high alignment precision, and makes the process simple. As illustrated in FIG. 3, it is possible that the negative electrode film 9 is formed on the insulating layer 7 having a width, which eliminates the need for high precision positioning.

As explained above, by the organic EL light emitting device relating to Embodiment 1 of the present invention, it is possible to make the process simple, and increase the aperture ratio. More specifically, since the protective layer and the insulating layer surely insulate the positive electrode from the negative electrode, it is possible to make the process simple and the positive electrode contact portion and the negative electrode contact portion bring about a narrow frame, thereby increasing the aperture ratio.

By using the manufacturing method of Embodiment 1, the shape of a transparent electrode film such as ITO is made simple, and it is possible to prevent short circuiting while eliminating the need for a high alignment precision, and it is also possible to reduce the total number of processes.

In particular, in the present Embodiment, the transparent electrode film is not formed into a light emitting shape, but made into a predetermined light emitting shape of the organic EL light emitting device by covering the transparent electrode film with a protecting film or the like. Therefore, there is no need performing patterning on the transparent electrode film by photoetching or the like, and thus irregularity or roughness on the surface of the transparent electrode film does not occur. As the result, the process becomes simple, as well as, short circuiting does not occur, which leads to decrease in the defect ratio.

By forming the positive electrode contact portion and the negative electrode contact portion in different layers, there is no risk of short circuiting due to the contact. It is also possible to make the connection between the transparent electrode film which is a positive electrode and the positive electrode contact portion, and the connection between the negative electrode film and the negative electrode contact portion sure. By the connection with each of electrode portions formed in optional shapes, it becomes possible to form an organic EL light emitting device having a large aperture. Further, in the design of the organic EL light emitting device, the frame is capable of being made narrow, by which the total luminous flux improves, thereby enabling power-saving.

Embodiment 2

FIGS. 4A-4F are configuration plan views illustrating one example of a manufacturing process of an organic EL light emitting device relating to Embodiment 2 of the present invention. FIG. 5 is a configuration cross section of an organic EL light emitting device relating to Embodiment 2. FIGS. 5A and 5B illustrate cross sections taken along line Y2-Y2 in FIG. 4F. FIG. 5C illustrates a cross section taken along line X2-X2 in FIG. 4F.

In an organic EL light emitting device 101 relating to Embodiment 2, a positive electrode contact portion 4 is provided at the periphery thereof and power is supplied from four directions. However, that a transparent electrode film 2 is formed without a gap on a substrate across an area including areas of layers other than the transparent electrode film 2 and that the positive electrode contact portion 4 and a negative electrode contact portion 51 are formed in different layers are similar to the organic EL light emitting device 100 relating to Embodiment 1.

Specifically, the organic EL light emitting device 101 relating to Embodiment 2 is formed by covering the positive electrode contact portion 4 which also serves as a power supplying portion to an organic EL element with a protective layer (insulating layer 7) and laminating thereon a negative electrode contact portion 5 which also serves as the power supplying portion to the organic EL element and a negative electrode contact and negative electrode takeoff portion 51 (hereinafter, referred to as "negative electrode takeoff portion 51"). In Embodiment 2, it is possible that the protective layer 3 and the insulating layer 7 in Embodiment 1 are formed integrally by the same materials at the same time (in the same process). In FIGS. 4C to 4F, the insulating layer 7 is illustrated to include the protective layer 3. In other words, in Embodiment 2, the insulating layer 7 has a function of the protective layer 3 in Embodiment 1 (a transparent electrode film and a positive electrode contact portion are separated and electrically insulated from the negative electrode contact portion).

The organic EL light emitting device 101 comprises a substrate 1, a transparent electrode film (positive electrode film) 2, a positive electrode contact portion 4, a positive electrode contact hole and positive electrode takeoff portion 41 (hereinafter, referred to as "positive electrode contact hole portion 41"), a negative electrode takeoff portion 51, an auxiliary electrode 6, an insulating layer 7, an organic light emitting layer 8, and a negative electrode film 9.

In the manufacturing method of the organic EL light emitting device 101, first, as illustrated in FIG. 4A, the transparent electrode film 2 is formed uniformly on substantially the whole surface of the substrate 1. On the periphery of the transparent electrode film 2, the positive electrode contact portion 4 is formed in a ring shape; on the transparent electrode film 2, the auxiliary electrode 6 is also formed (see FIG. 4B).

Next, the insulating layer 7 is formed such that the positive electrode contact portion 4 and the auxiliary electrode 6 are covered. At the same time, the insulating layer 7 is formed to open a light emitting portion to fit the light emitting shape of the organic EL light emitting device 101. An opening of the insulating layer 7 illustrated in FIG. 4C where the transparent electrode film 2 is exposed is the light emitting portion. At the same time, the positive electrode contact hole portion 41 is formed such that a spot on which the positive electrode contact hole portion 41 is formed on the positive electrode contact portion 4 is not covered by the insulating layer 7 (see FIG. 4C). Since it is possible to perform this process at the same time as a process of patterning the insulating layer 7, the number of process procedures does not increase.

As illustrated in FIG. 4D, the organic light emitting layer 8 is then formed to cover the whole portion of the transparent electrode film 2 which is not covered by the positive electrode contact portion 4, the auxiliary electrode 6 and the insulating layer 7. Further, as illustrated in FIG. 4E, the negative electrode film 9 is formed to cover organic light emitting layer 8. The negative electrode takeoff portion 51 which is in contact with at least a part of the negative electrode film 9 and is electrically connected thereto is formed to complete the manufacturing of the organic EL light emitting device 101 (see FIG. 4F). As illustrated in FIG. 4F, the negative electrode takeoff portion 51 is formed such that the negative electrode takeoff portion 51 is in contact with the circumferential edges of the negative electrode film 9 to surround substantially the whole circumference of the negative electrode film 9. By this, it is possible to supply power to the negative electrode film 9 evenly from four sides, which reduces luminance unevenness of the light emitting of the organic light emitting layer 8.

In FIGS. 4D and 4E, it is possible that the organic light emitting layer 8 and the negative electrode film 9 are formed such that a part of each of the organic light emitting layer 8 and the negative electrode film 9 is laid on the insulating layer 7 having a predetermined width, for example in a circumferential shape. As the result, this eliminates the need for a shadow mask requiring a high alignment precision, and it becomes possible to make the process simple.

FIGS. 5A and 5C illustrate a case where the organic light emitting layer 8 is not interposed between the positive electrode contact portion 4 and the negative electrode film 9. FIG. 5B illustrates a cross section in a case where the organic light emitting layer 8 overreaches from the opening of the insulating layer 7 further to the position of the positive electrode contact portion 4. As illustrated in FIGS. 5A to 5C, since the positive electrode contact portion 4, and the negative electrode film 9 and the negative electrode takeoff portion 51 are formed in different layers, it is possible to form the negative electrode film 9 and the negative electrode takeoff portion 51 as far as the very edge of the insulating layer 7.

FIG. 6 is a configuration plan view illustrating another configuration of the organic EL light emitting device relating to Embodiment 2. In FIG. 6, the negative electrode takeoff portion 51 is arranged at a corner adjacent to the positive electrode contact hole portion 41. It is possible that the negative electrode takeoff portion 51 is arranged at an optional position as long as the negative electrode takeoff portion 51 is in contact with at least a part of the negative electrode film 9.

FIGS. 7A and 7B are configuration cross section of another configuration of the organic EL light emitting device relating to Embodiment 2, illustrating cross sections taken along line Y3-Y3 in FIG. 6. As illustrated in FIGS. 7A and 7B, since the positive electrode contact portion 4, and the negative electrode film 9 and negative electrode takeoff portion 51 are formed in different layers, it is possible to form the negative electrode film 9 and the negative electrode takeoff portion 51 as far as the very edge of the insulating layer 7. As is clear from FIGS. 4 to 7, it is possible that the positive electrode contact hole portion 41 and the negative electrode takeoff portion 51 are freely arranged as long as the positive electrode contact hole portion 41 is not overlapped by the negative electrode film 9 or the negative electrode takeoff portion 51.

As explained above, by the organic EL light emitting device relating to Embodiment 2 of the present invention, the process becomes simple and it is possible to increase the aperture ratio.

By using the manufacturing method of Embodiment 2, it is possible that the shape of the transparent electrode film such as ITO is made simple, and short circuiting is prevented while eliminating the need for a high alignment precision. It is also possible to reduce the number of whole process procedures. It is possible that the positive electrode contact portion is formed surroundingly from four sides, thereby reducing in-plane luminance variation.

Embodiment 3

FIGS. 8A-8F are configuration plan views illustrating one example of a manufacturing process of an organic EL light emitting device relating to Embodiment 3 of the present invention. FIGS. 9A and 9B are configuration cross sections of an organic EL light emitting device relating to Embodiment 3, illustrating a cross section taken along line X4-X4 in FIG. 8F. FIG. 10 is a configuration cross section of an organic EL light emitting device relating to Embodiment 3, illustrating a cross section taken along line Y4-Y4 in FIG. 8F.

In an organic EL light emitting device 102 relating to Embodiment 3, a negative electrode contact portion 5 is formed on a positive electrode contact portion 4 sandwiching a protective layer 3. However, that a transparent electrode film 2 is formed without a gap on a substrate across an area including areas where layers other than the transparent electrode film 2 are formed and that the positive electrode contact portion 4 and a negative electrode contact portion 5 are formed in different layers are similar to the organic EL light emitting device 100 relating to Embodiment 1.

The organic EL light emitting device 102 comprises a substrate 1, a transparent electrode film (positive electrode film) 2, a positive electrode contact portion 4, a positive electrode contact hole portion 41, a negative electrode contact portion 5, an auxiliary electrode 6, an insulating layer 7, an organic light emitting layer 8, and a negative electrode film 9.

The manufacturing method of the organic EL light emitting device 102 relating to Embodiment 3 will be explained by way of FIG. 8. First, as illustrated in FIG. 8A, the transparent electrode film 2 is uniformly formed on substantially the whole surface of the substrate 1.

Next, the positive electrode contact portion 4 is formed such that the positive electrode contact portion 4 surrounds the circumference of the transparent electrode film 2, for example, in a ring shape. In addition, the auxiliary electrode 6 is formed on the transparent electrode film 2. It is possible that the positive electrode contact portion 4 and the auxiliary electrode 6 are formed at the same time (see FIG. 8B). The protective layer 3 is then formed, for example in a ring shape, such that the positive electrode contact portion 4 excepting a part of the positive electrode contact portion 4 is covered. At this point, an inside portion which is surrounded by the protective layer 3 (the inside of the opening of the protective layer 3) becomes the light emitting shape of organic EL light emitting device 102 (light emitting portion). Here, in the present Embodiment, the protective layer 3 is formed such that the light emitting portion is opened, and the protective layer 3 has a function of the insulating layer 7 in Embodiment 1. The insulating layer 7 is formed in gridlike fashion such that the insulating layer 7 covers the auxiliary electrode 6 (see FIG. 8C). At this time, the protective layer 3 is formed on the positive electrode contact portion 4 excluding a part thereof to secure an electrode takeoff portion for supplying power from the positive electrode contact portion 4. It is possible that the protective layer 3 is not distinguished from the insulating layer 7, and that they are made of the same material and are formed at the same time. By forming the protective layer 3 and the insulating layer 7 at the same time, the number of processes does not increase and it is possible to reduce the number of manufacturing processes.

As illustrated in FIG. 8D, the negative electrode contact portion 5 is formed on the protective layer 3 and/or the insulating layer 7. At this time, by forming the negative electrode contact portion 5 such that the negative electrode contact portion 5 surrounds the circumference of the transparent electrode film 2 excluding the portion where the positive electrode contact portion 4 is exposed, it is possible that the below-mentioned negative electrode film 9 which is to be arranged and the negative electrode contact portion 5 are brought into contact substantially from four directions, thereby reducing in-plane luminance variation.

Thereafter, as illustrated in FIG. 8E, the organic light emitting layer 8 is formed avoiding the positive electrode contact portion 4. As illustrated in FIG. 8F, the negative electrode film 9 is formed avoiding the positive electrode contact portion 4 to complete the manufacturing of the organic EL light emitting device 102.

In FIG. 8E and FIG. 8F, it is possible that the organic light emitting layer 8 and the negative electrode film 9 are formed such that a part of each of the organic light emitting layer 8 and the negative electrode film 9 is laid on the protective layer 3 and/or the insulating layer 7 having a predetermined width. As the result, this eliminates the need for a shadow mask requiring a high alignment precision, and it becomes possible to make the process simple.

Figure 12:
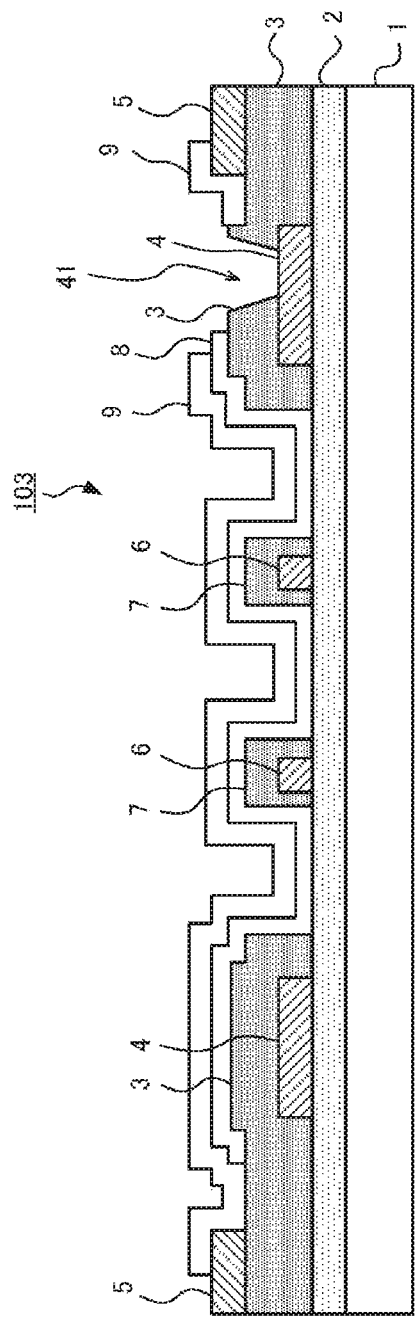
FIG. 12 is a configuration cross section of an organic EL light emitting device relating to a modification of Embodiment 3, illustrating a cross section taken along line Y5-Y5 in FIG. 11F.

FIGS. 9A and 9C illustrate a case where the organic light emitting layer 8 is not interposed between the positive electrode contact portion 4 and the negative electrode film 9. FIG. 9B illustrates a cross section in a case where the organic light emitting layer 8 overreaches from the aperture of the insulating layer 7 further to the position of the positive electrode contact portion 4. As illustrated in FIGS. 9A to 9C, since the positive electrode contact portion 4, and the negative electrode film 9 and the negative electrode takeoff portion 51 are formed in different layers, it is possible to form the negative electrode film 9 and the negative electrode takeoff portion 51 as far as the very edge of the insulating layer 7. As FIGS. 11A-11F are configuration plan views illustrate the result, it is possible that the aperture ratio of the light emitting shape is made large.ng one example of the manufacturing process of an organic EL light emitting device relating to a modification of Embodiment 3 of the present invention. FIG. 12 is a configuration cross section of an organic EL light emitting device relating to a modification of Embodiment 3, illustrating a cross section taken along line Y5-Y5 in FIG. 11F.

In the modification of Embodiment 3 of the present invention, although the organic EL light emitting device has basically the same structure as that of the organic EL light emitting device 102 relating to Embodiment 3, the organic EL light emitting device comprises the positive electrode contact hole portion 41 in which a hole is formed on a part of the insulating film or the like, and power is supplied via the positive electrode contact hole portion 41.

The manufacturing method of the organic EL light emitting device 103 relating to the modification of Embodiment 3 will be explained by way of FIG. 11. First, as illustrated in FIG. 11A, the transparent electrode film 2 is formed uniformly substantially the whole surface of the substrate 1.

Next, the positive electrode contact portion 4 is formed in a ring shape substantially surroundingly along the outermost periphery portion inside the outermost periphery portion avoiding the outermost periphery portion of the transparent electrode film 2. The auxiliary electrode 6 is formed on the transparent electrode film 2. The positive electrode contact portion 4 and the auxiliary electrode 6 are formed at the same time (see FIG. 11B).

The protective layer 3 is formed on a circumference portion including the outermost periphery portion of the transparent electrode film 2 and the positive electrode contact portion 4 positioned inside the outermost periphery portion such that the protective layer 3 covers the circumference portion including the transparent electrode film 2 and the positive electrode contact portion 4 excluding a portion (a part to be a hole for forming the positive electrode contact hole portion 41). At this point, an inside portion which is surrounded by the protective layer 3 (the inside of the opening of the protective layer 3) becomes the light emitting shape of organic EL light emitting device 102 (light emitting portion). Here, in the present Embodiment, the protective layer 3 is formed such that the light emitting portion is opened, and the protective layer 3 has a function of the insulating layer 7 in Embodiment 1. The insulating layer 7 covers the auxiliary electrode 6 (see FIG. 11C).

At this time, a hole is provided on a part which covers the positive electrode contact portion 4 to form the protective layer 3. The hole is the positive electrode contact hole portion 41 and serves as an electrode takeoff portion for supplying power via the positive electrode contact portion 4 (see FIG. 12). It is possible that the protective layer 3 is not distinguished from the insulating layer 7, and that they are made of the same material and are formed at the same time.

As illustrated in FIG. 11D, the negative electrode contact portion 5 is formed on the protective layer 3 along the outer periphery portion of the transparent electrode film 2. By providing a part where the positive electrode contact portion 4 is not formed under the protective layer 3, it is possible to form the transparent electrode film 2, the protective layer 3 and the negative electrode contact portion 5 on the substrate 1 in the order mentioned thereby reducing the whole thickness. It is possible that the negative electrode contact portion 5 and the positive electrode contact portion 4 are surely electrically insulated by the protective layer 3 (see FIG. 12).

Thereafter, as illustrated in FIG. 11E, the organic light emitting layer 8 is formed avoiding the positive electrode contact hole portion 41; as illustrated in FIG. 11F, the negative electrode film 9 is formed avoiding the positive electrode contact hole portion 41 (see FIG. 12), to complete the manufacturing of the organic EL light emitting device 103.

In FIG. 11E and FIG. 11F, it is possible that the organic light emitting layer 8 and the negative electrode film 9 are formed such that a part of each of the organic light emitting layer 8 and the negative electrode film 9 is laid on the protective layer 3 and/or the insulating layer 7 having a predetermined width As the result, this eliminates the need for a shadow mask requiring a high alignment precision, and it becomes possible to make the process simple. As is clear from FIG. 12, since the positive electrode contact portion 4 and the auxiliary electrode 6 are covered by the protective layer 3 or the insulating layer 7 and the negative electrode film 9 and the negative electrode takeoff layer 51 are insulated from each other, the negative electrode film 9 and the positive electrode contact portion 4 do not short even when the edge of the organic light emitting layer 8 is positioned over the positive electrode contact portion 4.

As explained above, by the organic EL light emitting device relating to Embodiment 3 and the modification of Embodiment 3 of the present invention, the process becomes simple and it is possible to increase the aperture ratio.

By using the manufacturing method of Embodiment 3, it is possible that the shape of the transparent electrode film such as ITO is made simple, and short circuiting is prevented while eliminating the need for a high alignment precision. It is also possible to reduce the number of whole process procedures. It is possible that the positive electrode contact portion is formed surroundingly from four sides, thereby reducing in-plane luminance variation.

It is possible that the connection between the transparent electrode film which is a positive electrode and the positive electrode contact portion, and the connection between the negative electrode film and the negative electrode contact portion are individually ensured, and it is further possible that power is surely connected to the outer periphery portion of the organic EL light emitting device. As the result, it becomes possible to form an organic EL light emitting device connectable with and having less effect on the shape of the organic EL and having a large aperture. It is also possible to attain an organic EL light emitting device whose power supply is stable. Further, as illustrated in the modification of Embodiment 3, by forming the device such that the positive electrode contact portion and the negative electrode contact portion are not overlapped vertically, it is possible to form an organic EL light emitting device having a small thickness.

Embodiment 4

FIGS. 13A-13G are configuration plan views illustrating one example of a manufacturing process of an organic EL light emitting device relating to Embodiment 4 of the present invention. In the organic EL light emitting device relating to Embodiment 4, a negative electrode contact portion is formed on the outer periphery of a positive electrode contact portion. However, that a transparent electrode film is formed without a gap on a substrate across an area including areas of layers other than the transparent electrode film and that the positive electrode contact portion and a negative electrode contact portion are formed in different layers are similar to the organic EL light emitting device relating to Embodiment 1.

Specifically, the organic EL light emitting device 104 relating to Embodiment 4 comprises a negative electrode contact portion 5 at the outer periphery of a positive electrode contact portion 4. The negative electrode contact portion 5 has a discontinuous shape, and on the gap portion, there is provided the positive electrode contact hole portion 41 for the external connection via the positive electrode contact portion 4.

The organic EL light emitting device 104 comprises a substrate 1, a transparent electrode film (positive electrode film) 2, a protective layer 3, a positive electrode contact portion 4, a positive electrode contact hole portion 41, a negative electrode contact portion 5, an auxiliary electrode 6, an insulating layer 7, an organic light emitting layer 8, and a negative electrode film 9.

In the manufacturing method of the organic EL light emitting device 104 relating to Embodiment 4, first, as illustrated in FIG. 13A, the transparent electrode film 2 is uniformly formed on substantially the whole surface of the substrate 1. A protecting film 31 is formed in a ring shape on the outer periphery portion of the transparent electrode film 2 avoiding a center portion of the transparent electrode film 2 (see FIG. 13B). The positive electrode contact portion 4 is formed in contact with the inner circumference of the transparent electrode film 2 facing an inside portion which is not covered by the protecting film 31. Further, the positive electrode contact hole portion 41 connecting to the positive electrode contact portion is formed, and the auxiliary electrode 6 is formed on the transparent electrode film 2 (see FIG. 13C).

The protective layer 3 is further formed on the outer periphery of the substrate 1, namely on the protective layer 31 avoiding the positive electrode contact portion 4 and the positive electrode contact hole portion 41. In addition, the insulating layer 7 is formed to comprise an opening to fit the light emitting shape of the organic EL light emitting device 104. The inside region of the opening is a light emitting portion of the organic EL light emitting device 100 (light emitting region). A part of the insulating layer 7 is formed in gridlike fashion such that the part of the insulating layer 7 further covers the auxiliary electrode 6 inside the opening (see FIG. 13D). It is possible that the protective layer 3 and the insulating layer 7 are formed of the same material and formed at the same time. When the protective layer 31 is formed in FIG. 13B, it is possible that the transparent electrode film 2 is covered by the protective layer 31 to fit the light emitting shape in advance to omit the process of covering the portion other than the light emitting surface of the transparent electrode film 2 by the insulating layer 7 in FIG. 13D.

In FIG. 13E, negative electrode contact portion 5 is formed on the formed protective layer 3. At this time, the negative electrode contact portion 5 is on the protective layer 3, and the negative electrode contact portion 5 and the positive contact portion 4 are formed in different layers. As illustrated in FIG. 11F, it is possible that the negative electrode contact portion 5 has a shape in which the positive electrode contact hole portion 41 is surrounded by the negative electrode contact portion 5.

Thereafter, as illustrated in FIG. 13F, the organic light emitting layer 8 is formed. As illustrated in FIG. 13G, the negative electrode film 9 is formed to complete the manufacturing of the organic EL light emitting device 104.

In FIG. 13F and FIG. 13G, it is possible that the organic light emitting layer 8 and the negative electrode film 9 are formed such that a part of each of the organic light emitting layer 8 and the negative electrode film 9 is laid on the insulating layer 7 having a predetermined width As the result, this eliminates the need for a shadow mask requiring a high alignment precision, and it becomes possible to make the process simple.

Figure 14A:
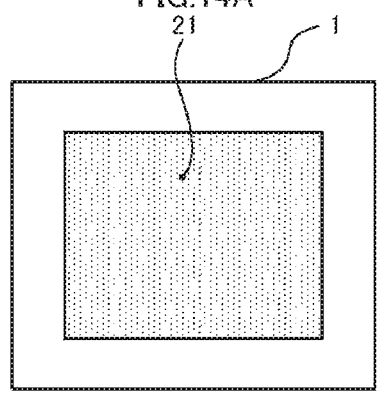
FIG. 14A is a configuration plan view illustrating one example of a manufacturing process of an organic EL light emitting device relating to a modification of Embodiment 4 of the present invention.
Figure 14B:
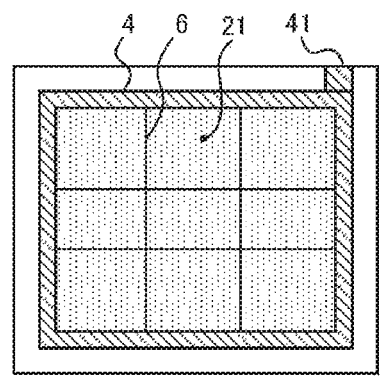
FIG. 14B is a configuration plan view illustrating one example of a manufacturing process of an organic EL light emitting device relating to a modification of Embodiment 4 of the present invention.
Figure 14C:
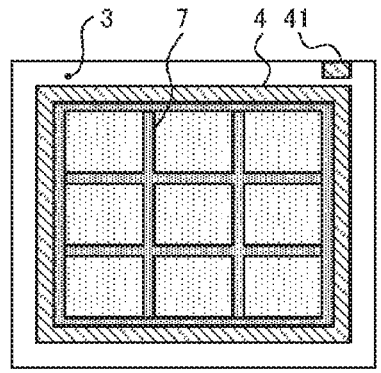
FIG. 14C is a configuration plan view illustrating one example of a manufacturing process of an organic EL light emitting device relating to a modification of Embodiment 4 of the present invention.

FIGS. 14A-14C are configuration plan views illustrating one example of the manufacturing process of an organic EL light emitting device relating to a modification of Embodiment 4 of the present invention. As illustrated in FIG. 14A, the state in which the transparent electrode film (positive electrode film) 21 formed on the substrate 1 is formed avoiding the outer periphery of the substrate 1 in advance, is substantially the same the state in which processes in FIG. 13A and FIG. 13B are completed.

Next, as illustrated in FIG. 14B, the positive electrode contact portion 4 is formed directly on the substrate 1 in contact with the circumference of the transparent electrode film 21. As illustrated in FIG. 14C, the protective layer 3 is formed avoiding the positive electrode contact portion 4 and positive electrode contact hole portion 41. The insulating layer 7 is formed to cover the auxiliary electrode 6. At the same time, the insulating layer 7 is formed to open the light emitting portion to fit the light emitting shape of the organic EL light emitting device 104.

The process in FIG. 14C is substantially similar to the process in FIG. 13D except that in place of forming the protective layer 3 on the protective layer 31, the protective layer 3 is formed on the substrate 1. The processes in FIG. 14C and forward are the same as the processes in FIG. 13D and forward. As in a modification of Embodiment 4 of the present invention in FIG. 14, when the transparent electrode film 21 is formed on the substrate 1 avoiding the outer periphery portion, it is possible that a part of the manufacturing processes is omitted.

Figure 15A:
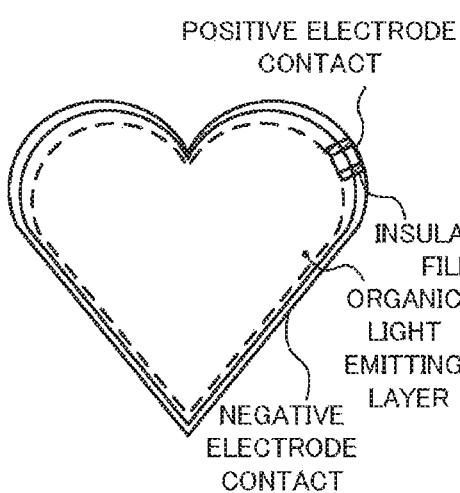
FIG. 15A is one example of the shape of an organic EL light emitting device relating to Embodiment 4.
Figure 15B:
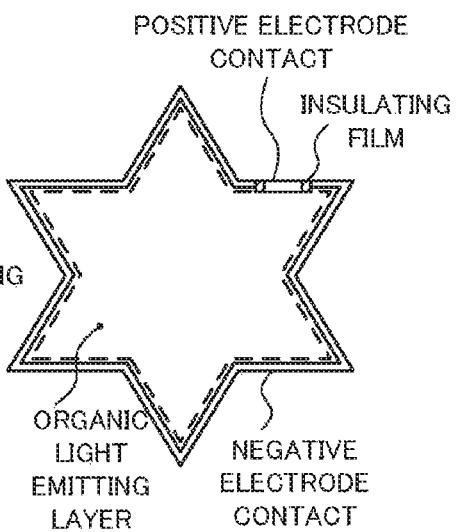
FIG. 15B is one example of the shape of an organic EL light emitting device relating to Embodiment 4.

FIGS. 15A and 15B illustrate one example of the shape of the organic EL light emitting device relating to Embodiment 4. Dotted lines in the figures represent the light emitting shape. In particular, when the device is manufactured by the manufacturing method of an organic EL light emitting device relating to Embodiment 4, it is possible to make the flexibility of the shape of the organic EL light emitting device high.

FIG. 15A illustrates an example of a heart-shaped organic EL light emitting device. FIG. 15B illustrates an example of a star-shaped organic EL light emitting device. The organic EL light emitting device comprises a positive electrode covered by an insulating film and insulated from a negative electrode contact at a part anywhere on the circumference surrounded by a negative electrode contact. As illustrated in FIG. 15, it is possible to manufacture an organic EL light emitting device even when the light emitting surface has a relatively complex shape such as it has a curved line or multiple sides not a rectangle.

As explained above, by the organic EL light emitting device relating to Embodiment 4 of the present invention, the process becomes simple and it is possible to increase the aperture ratio.

By using the manufacturing method of Embodiment 4, it is possible that the shape of the transparent electrode film such as ITO is made simple, and short circuiting is prevented while eliminating the need for a high alignment precision. It is also possible to reduce the number of whole process procedures. It is possible that the positive electrode contact portion is formed surroundingly from four sides, thereby reducing in-plane luminance variation.

In addition, it is possible to form a surface light emitting element in an arbitrary shape, and it is possible to attain an organic EL light emitting device with high designability. Since the surface light emitting element has an arbitrary shape, the number of components when the organic EL light emitting device is used as an illumination device is reduced, which eliminates the need for a light emitting element which is not needed for light emission. As the result, a low cost or an energy-saving property is obtained.

Further, regardless of the shape of the organic EL light emitting device, by forming the light emitting shape of the light emitting surface by covering the portion other than the light emitting surface using a resist, there is no risk of render a transparent electrode film such as ITO defective, and reduction in the defect ratio and simple manufacturing are attained. In addition, it is possible to make the area of an edge portion serving as an electrode takeoff portion small, to attain an illumination device having a high aperture ratio.

In a related art, since a negative electrode-side electrode takeoff portion (negative electrode contact portion) is formed of ITO, and the contact with a negative electrode formed of Al becomes Al-ITO, and thus the Schottky contact property is high, causing a problem that an ohmic contact is not obtained. In addition, a problem of decrease in reliability of the electrode portion has occurred, for example, the contact resistance is increased because oxygen in the ITO is pulled out by Al. Further, since the electrode takeoff portion (electrode contact portion) of the positive electrode and the negative electrode is ITO, the wiring resistance thereof is high and the contact resistance with wirings for a power source is large, and therefore, the driving voltage is elevated and a large amount of electric power is required, which have been problematic.

However, since, in the organic EL light emitting device of the present Embodiment, the electrode contact portion is formed of a metal, the portion has a higher reliability than that of an ITO takeoff of a related art, which reduces the contact resistance and the wiring resistance. The degree of rise in the driving voltage is reduced, thereby enabling power-saving.

In addition, the wiring resistance becomes high for reasons such as that a transparent electrode layer which is an anode and a cathode layer used for the organic EL element has a high specific resistance, or that the layers have a high sheet resistance since they are a thin layer even though the layers are made of a metal. The wiring resistance becomes high depending on whether there is a power supplying terminal portion (side) or not, or the distance from a power supplying terminal portion. Further, there has occurred a problem that luminance unevenness occurs due to a voltage drop. However, in the organic EL light emitting device of the present Embodiment, input from each of four sides of the anode and/or the cathode is possible, and the wiring resistance is made minimum, leading to improvement of luminance unevenness, thereby enabling power-saving.

The manufacturing method of an organic EL light emitting device of the present invention eliminates the need for patterning of an transparent electrode such as ITO, whereby ITO film is formed only by a film formation. By this, etching roughness on the surface or the edge of ITO does not occur, and it is possible to eliminate photoetching and/or photolithography process accompanied by ITO patterning.

Further, it is possible to obtain an effect when multiple surface patterns is performed on a large-scale substrate during production in large quantities. By using the organic EL light emitting device of the present invention, it is possible to obtain a very large effect in view of the reliability and cost.

Example 1

An organic EL light emitting device having a structure corresponding to Embodiment 1 was manufactured. A light emitting area of the light emitting area of the organic EL light emitting device was 100 mm×100 mm, and a white light was emitted. As a transparent electrode film, ITO having a film thickness of 110 nm was used. In the present Example, the organic layer (organic light emitting layer) had a six-layered structure in which a hole injection layer, a hole transport layer, a light emitting layer (a first light emitting layer and a second light emitting layer), a hole blocking layer and an electron transport layer are laminated in the order mentioned.

The hole injection layer was formed by using Cu-Pc (copper phthalocyanine) as a hole injection material. The hole transport layer was formed by using α-NPD (N,N'-diphenyl-N—N-bis(1-naphthyl)-1,1'-biphenyl)-4,4'-di-amine) as a hole transport material. For the first light emitting layer, one formed by using CBP (4,4'-biscarbazolylbiphenyl) as a host and by doping Jr (ppy)$_3$ (tris-(2phelynyl pyridine) iridium complex) and Btp$_2$Ir (acac) (bis(2-(2'-benzo (4,5-α) thienyl)pyridinate-N,C2') (acetylacetonate) iridium complex) was used. Further, for the second light emitting layer, one formed by using CBP as a host, and doping FIr (pic) ((bis(4,6-di-fluorophenyl)-pyridinate-N,C2') picolinate iridium complex) was used. For the hole blocking layer, BCP (2,9-dimethyl-4,7-diphenyl-1,10-phenanthroline) was used; for the electron transport layer, Alq$_3$ was used.

Between the organic layer and the negative electrode film, an electron injection layer using LiF was formed. The total film thickness of the organic layer and the electron injection layer was 145 nm. For the negative electrode film, Al having a film thickness of 100 nm was used.

When the organic EL light emitting device of the present Example was illuminated using a driving current of 25 A/m$^2$ at a constant current, the driving voltage was 4.7 V, and the luminance was 920 cd/m$^2$. For the in-plane luminance unevenness of the organic EL lighting panel, nine points in the plane was measured and calculated (difference between the maximum luminance and the minimum luminance)/ maximum luminance. The result was 4%.

The organic EL light emitting device was continuously illuminated at the above-mentioned current density, to generate no fault such as short circuiting. The organic EL light emitting device was capable of being illuminated stable after exceeding 10000 hours.

The present invention is not limited to the above-mentioned Embodiments, and a variety of Embodiments are possible within the scope of the present invention.

Although, in each of the above-mentioned Embodiments, constitutions having an auxiliary electrode was explained by way of example, the present invention is not limited thereto. It is also possible that the auxiliary electrode is not formed, and the shape of the auxiliary electrode is not limited to gridlike fashion.

It is possible that a part or the whole of the above-mentioned Embodiment is as described in the following appendices, but not limited thereto.

Appendix 1

An organic EL light emitting device comprising
a transparent substrate,
a transparent electrode film formed on the substrate,
a positive electrode contact portion that is electrically connected to the transparent electrode film as a part of the transparent electrode film,
an insulating layer formed on the transparent electrode film such that a light emitting portion is opened,
an organic light emitting layer formed on the transparent electrode film and on the insulating layer,
a negative electrode layer formed on the organic light emitting layer,
a negative electrode contact portion that is in contact with at least part of the negative electrode layer and that is electrically connected to the negative electrode layer, and
a protective layer that, in order to separate and electrically insulate the transparent electrode film and the positive electrode contact portion from the negative electrode contact portion, is formed therebetween, wherein
the positive electrode contact portion and the negative electrode contact portion are electrically insulated by the insulating layer or the protective layer; and
the transparent electrode film is formed without a gap across an area on the substrate including areas where the positive electrode contact portion, the insulating layer, the organic light emitting layer, the negative electrode layer, the negative electrode contact portion and the protective layer are formed.

Appendix 2

The organic EL light emitting device according to Appendix 1, wherein the positive electrode contact portion and the negative electrode contact portion are formed such that the heights thereof from the substrate are different from each other.

Appendix 3

The organic EL light emitting device according to Appendix 1 or 2, comprising
an auxiliary electrode formed on the transparent electrode film, and
an insulating layer formed on the auxiliary electrode.

Appendix 4

The organic EL light emitting device according to any one of Appendices 1 to 3, wherein the transparent electrode film is uniformly formed on the substrate without patterning.

Appendix 5

A manufacturing method of an organic EL light emitting device comprising
  forming a transparent electrode film on a transparent substrate,
  forming a positive electrode contact portion that is electrically connected to the transparent electrode film as a part of the transparent electrode film,
  forming a negative electrode contact portion on a part of upper side of the transparent electrode film such that the negative electrode contact portion is separated from the transparent electrode film and the positive electrode contact portion,
  forming an insulating layer on the transparent electrode film such that a light emitting portion is opened,
  forming an organic light emitting layer on the transparent electrode film and on the insulating layer, and
  forming a negative electrode layer that is electrically connected to the negative electrode contact portion on the organic light emitting layer such that the negative electrode layer is separated from the transparent electrode film and the positive electrode contact portion, and further comprising
  before the forming a negative electrode contact portion, forming a protective layer for electrically insulating the transparent electrode film and the positive electrode contact portion from the negative electrode contact portion between the transparent electrode film and the positive electrode contact portion, and the negative electrode contact portion.

Appendix 6

The manufacturing method of an organic EL light emitting device according to Appendix 5, comprising
  before the forming a positive electrode contact portion, forming the protective layer on the transparent electrode film, wherein
  the negative electrode contact portion is formed on the protective layer.

Appendix 7

The manufacturing method of an organic EL light emitting device according to Appendix 5 or 6, wherein, in the forming a negative electrode contact portion, the negative electrode contact portion is formed at a height different from the height where the positive electrode contact portion is formed from the substrate.

Appendix 8

The manufacturing method of an organic EL light emitting device according to any one of Appendices 5 to 7, comprising
  forming an auxiliary electrode on the transparent electrode film, and
  forming the insulating layer on the auxiliary electrode.

Appendix 9

The manufacturing method of an organic EL light emitting device according to Appendix 8, wherein the forming an auxiliary electrode and the forming a positive electrode contact portion are performed at the same time.

Appendix 10

The manufacturing method of an organic EL light emitting device according to any one of Appendices 5 to 9, wherein, in the forming a transparent electrode film, the transparent electrode film is formed uniformly on the substrate without patterning.

Appendix 11

An organic EL illumination device comprising the organic EL light emitting device according to any one of Appendices 1 to 4.

Appendix 12

An organic EL illumination device comprising an organic EL light emitting device manufactured by the manufacturing method of an organic EL light emitting device according to Appendices 5 to 10.

This application claims priority from Japanese Patent Application No. 2011-073273, filed on May 29, 2011 in Japan. DESCRIPTION, CLAIMS, and DRAWINGS of Japanese Patent Application No. 2011-073273 are hereby incorporated by reference.

INDUSTRIAL APPLICABILITY

The present invention is applicable to an organic EL light emitting device, a manufacturing method of an organic EL light emitting device and an organic EL illumination device.

REFERENCE SIGNS LIST

1 Substrate
2, 21 Transparent electrode film (positive electrode film)
3, 31 Protective layer
4 Positive electrode contact portion (positive electrode contact and power supplying portion)
5 Negative electrode contact portion (negative electrode contact and power supplying portion)
6 Auxiliary electrode
7 Insulator layer
8 Organic light emitting layer
9 Negative electrode film
41 Positive electrode contact hole portion (positive electrode contact hole and positive electrode takeoff portion)
51 Negative electrode takeoff portion (negative electrode contact and negative electrode takeoff portion)
100, 101, 102, 103, 104 Organic EL light emitting device

The invention claimed is:
1. An organic EL light emitting device comprising: a transparent substrate;
  a transparent electrode film formed on the substrate;
  a positive electrode contact portion that is electrically connected to the transparent electrode film as a part of the transparent electrode film;
  an insulating layer formed on the transparent electrode film such that a light emitting portion is opened;
  an organic light emitting layer formed on the transparent electrode film and on the insulating layer;
  a negative electrode layer formed on the organic light emitting layer;

a negative electrode contact portion that is in contact with at least part of the negative electrode layer and that is electrically connected to the negative electrode layer; and a protective layer that, in order to separate and electrically insulate the transparent electrode film and the positive electrode contact portion from the negative electrode contact portion, is formed therebetween, wherein the positive electrode contact portion and the negative electrode contact portion surround, viewed on a plane, an area in which the transparent electrode film, the organic light emitting layer and the negative electrode layer are superimposed.

2. An organic EL light emitting device according to claim 1, wherein: the positive electrode contact portion surrounds, in a circular pattern, an area in which the transparent electrode film, the organic light emitting layer and the negative electrode layer are superimposed; and the negative electrode contact portion surrounds, by forming a circle, an area in which the transparent electrode film, the organic light emitting layer and the negative electrode layer are superimposed such that a portion of the circle is opened.

3. An organic EL light emitting device according to claim 1, wherein:

the positive electrode contact portion and the negative electrode contact portion are electrically insulated by the insulating layer or the protective layer.

4. The organic EL light emitting device according to claim 1, wherein the positive electrode contact portion and the negative electrode contact portion are formed such that the heights thereof from the substrate are different to each other.

5. The organic EL light emitting device according to claim 1, comprising: an auxiliary electrode formed on the transparent electrode film; and an insulating layer formed on the auxiliary electrode.

6. A manufacturing method of an organic EL light emitting device comprising:

forming a transparent electrode film on a transparent substrate;

forming a positive electrode contact portion that is electrically connected to the transparent electrode film as a part of the transparent electrode film;

forming a negative electrode contact portion on a part of upper side of the transparent electrode film such that the negative electrode contact portion is separated from the transparent electrode film and the positive electrode contact portion;

forming an insulating layer on the transparent electrode film such that a light emitting portion is opened;

forming an organic light emitting layer on the transparent electrode film and on the insulating layer; and forming a negative electrode layer that is electrically connected to the negative electrode contact portion on the organic light emitting layer such that the negative electrode layer is separated from the transparent electrode film and the positive electrode contact portion, and further comprising:

forming a protective layer for electrically insulating the transparent electrode film and the positive electrode contact portion from the negative electrode contact portion between the transparent electrode film and the positive electrode contact portion, and the negative electrode contact portion, before forming the negative electrode contact portion; wherein the process of forming the positive electrode contact portion forms the positive electrode contact portion that surrounds, viewed on a plane, an area in which the transparent electrode film, the organic light emitting layer and the negative electrode layer are superimposed, and the process of forming the negative electrode contact portion forms the negative electrode contact portion that surrounds, viewed on a plane, an area in which the transparent electrode film, the organic light emitting layer and the negative electrode layer are superimposed.

7. The manufacturing method of an organic EL light emitting device according to claim 6, wherein:

the process of forming the positive electrode contact portion forms the positive electrode contact portion in a circular pattern; and the process of forming the negative electrode contact portion forms the negative electrode contact portion forming a circle such that a portion of the circle is opened.

8. The manufacturing method of an organic EL light emitting device according to claim 6, wherein the process of forming the negative electrode contact portion is formed such that a height thereof from the substrate is different from a height from a substrate at a portion in which the positive electrode contact portion is formed.

9. The manufacturing method of an organic EL light emitting device according to claim 6, further comprising:

forming an auxiliary electrode on the transparent electrode film and on the light emitting portion; and forming the insulating layer formed on the auxiliary electrode.

10. The manufacturing method of an organic EL light emitting device according to claim 9, wherein the process of forming the auxiliary electrode is performed concurrently with the process of forming the positive electrode contact portion.

11. An organic EL illumination device comprising the organic EL light emitting device according 15 to claim 1.

12. An organic EL illumination device comprising an organic EL light emitting device manufactured by the manufacturing method of an organic EL light emitting device according to claim 6.

* * * * *

UNITED STATES PATENT AND TRADEMARK OFFICE
CERTIFICATE OF CORRECTION

| | |
|---|---|
| PATENT NO. | : 9,537,114 B2 |
| APPLICATION NO. | : 14/991372 |
| DATED | : January 3, 2017 |
| INVENTOR(S) | : Yoshikazu Sakaguchi |

It is certified that error appears in the above-identified patent and that said Letters Patent is hereby corrected as shown below:

In the Specification

Column 10, Line 29:
"6" should be --5--;

Column 12, Line 16:
"(no)" should be --(ITO)--;

Column 18, Line 22:
After "layer 7.", delete "As";

Column 23, Line 43:
"Jr" should be --Ir--;

Column 23, Line 52:
"$Alg_3$" should be --$Alq_3$--.

Signed and Sealed this
Thirteenth Day of February, 2018

Andrei Iancu
*Director of the United States Patent and Trademark Office*